US012224282B2

(12) United States Patent
Song et al.

(10) Patent No.: US 12,224,282 B2
(45) Date of Patent: Feb. 11, 2025

(54) INTEGRATED CIRCUIT DEVICE INCLUDING METAL-OXIDE SEMICONDUCTOR TRANSISTORS

(71) Applicant: SAMSUNG ELECTRONICS CO., LTD., Suwon-si (KR)

(72) Inventors: Jinhyeok Song, Incheon (KR); Mingeun Song, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 18/198,496

(22) Filed: May 17, 2023

(65) Prior Publication Data

US 2023/0290777 A1 Sep. 14, 2023

Related U.S. Application Data

(63) Continuation of application No. 17/199,720, filed on Mar. 12, 2021, now Pat. No. 11,699,700.

(30) Foreign Application Priority Data

Sep. 8, 2020 (KR) .................. 10-2020-0114870

(51) Int. Cl.
*H01L 27/088* (2006.01)
*H01L 23/544* (2006.01)
*H01L 23/66* (2006.01)

(52) U.S. Cl.
CPC .......... *H01L 27/088* (2013.01); *H01L 23/544* (2013.01); *H01L 23/66* (2013.01)

(58) Field of Classification Search
CPC . H01L 27/088; H01L 27/0886; H01L 23/544; H01L 23/66; H01L 21/823431; H01L 21/823481; H01L 21/823437; H01L 21/823475; H01L 29/66795

See application file for complete search history.

(56) References Cited

U.S. PATENT DOCUMENTS

| 5,488,252 | A  | 1/1996  | Johansson et al. |
| 5,998,835 | A  | 2/1999  | Furukawa et al. |
| 6,483,188 | B1 | 11/2002 | Yue et al. |
| 8,869,085 | B2 | 10/2014 | Lu |

(Continued)

FOREIGN PATENT DOCUMENTS

| KR | 10-0346617 B1 | 7/2002 |
| TW | 202029409 A  | 8/2020 |

OTHER PUBLICATIONS

Extended European Search Report mailed Jan. 20, 2022, for corresponding EP Patent Application No. 21176374.3.

(Continued)

*Primary Examiner* — Dao H Nguyen
(74) *Attorney, Agent, or Firm* — Muir Patent Law, PLLC

(57) ABSTRACT

An integrated circuit device including an active region; an active cutting region at a side of the active region in a first direction; a fin active pattern extending on the active region in the first direction, the fin active pattern including a source region and a drain region; a gate pattern extending across the active region and the fin active pattern in a second direction perpendicular to the first direction, the gate pattern not being in the active cutting region; and an isolated gate contact region in contact with the gate pattern outside of the active region.

27 Claims, 19 Drawing Sheets

(56) References Cited

U.S. PATENT DOCUMENTS

| | | |
|---|---|---|
| 9,806,094 B2 | 10/2017 | Whitefield |
| 10,153,306 B2 | 12/2018 | Lee et al. |
| 10,347,627 B2 | 7/2019 | Cho et al. |
| 10,600,746 B2 | 3/2020 | Trang et al. |
| 10,637,411 B2 | 4/2020 | Vedula et al. |
| 10,665,706 B2 | 5/2020 | Mauder et al. |
| 2016/0155739 A1* | 6/2016 | Ting .................... H01L 29/6656 438/283 |
| 2016/0284836 A1* | 9/2016 | Liu ...................... H01L 27/1211 |
| 2016/0336183 A1* | 11/2016 | Yuan ................... H01L 27/0886 |
| 2019/0109570 A1* | 4/2019 | Vedula .................... H01L 23/66 |
| 2019/0393205 A1* | 12/2019 | Lee ....................... G06F 30/392 |
| 2020/0176447 A1 | 6/2020 | Pao et al. |
| 2021/0020635 A1 | 1/2021 | Chou |

OTHER PUBLICATIONS

Office Action dated Mar. 7, 2024 for corresponding TW Patent Application No. 110129232.

* cited by examiner

INTEGRATED CIRCUIT DEVICE INCLUDING METAL-OXIDE SEMICONDUCTOR TRANSISTORS

CROSS-REFERENCE TO RELATED APPLICATIONS

This is a continuation application based on pending application Ser. No. 17/199,720, filed Mar. 12, 2021, the entire contents of which is hereby incorporated by reference.

Korean Patent Application No. 10-2020-0114870, filed on Sep. 8, 2020, in the Korean Intellectual Property Office, and entitled: "Integrated Circuit Device Including Metal Oxide Semiconductor Transistors," is incorporated by reference herein in its entirety.

BACKGROUND

1. Field

Embodiments relate to an integrated circuit (IC) device including metal-oxide semiconductor (MOS) transistors.

2. Description of the Related Art

An IC device may include MOS transistors. With the development of the semiconductor industry, IC devices including MOS transistors are becoming highly integrated, e.g., downscaled. The highly integrated IC devices may be used in radio-frequency (RF) bands.

SUMMARY

The embodiments may be realized by providing an integrated circuit device including an active region; an active cutting region at a side of the active region in a first direction; a fin active pattern extending on the active region in the first direction, the fin active pattern including a source region and a drain region; a gate pattern extending across the active region and the fin active pattern in a second direction perpendicular to the first direction, the gate pattern not being in the active cutting region; and an isolated gate contact region in contact with the gate pattern outside of the active region.

The embodiments may be realized by providing an integrated circuit device including an active region; a fin active pattern extending on the active region in a first direction, the fin active pattern including a source region and a drain region; a gate pattern extending across the active region and the fin active pattern in a second direction perpendicular to the first direction; and a gate cutting region located around the active region and the fin active pattern such that the gate cutting region is spaced apart from the gate pattern on one side of the gate pattern in the first direction.

The embodiments may be realized by providing an integrated circuit device, comprising a plurality of unit metal-oxide semiconductor (MOS) transistors arranged in an array form apart from each other in a first direction and a second direction perpendicular to the first direction, wherein each of the unit MOS transistors includes an active region; a plurality of fin active patterns extending on the active region in the first direction and spaced apart from each other in the second direction, each fin active pattern including a source region and a drain region; active cutting regions on opposite sides of the active region in the first direction; a plurality of gate patterns extending across the active region and the plurality of fin active patterns in the second direction, the gate patterns of the plurality of gate patterns being spaced apart from each other in the first direction; gate cutting regions around the active region and the plurality of fin active patterns, the gate cutting regions being spaced apart from the plurality of gate patterns on opposite sides of the plurality of gate patterns in the first direction; and isolated gate contact regions in contact with the plurality of gate patterns outside the active region, the isolated gate contact regions being on opposite sides of the active region in the second direction.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
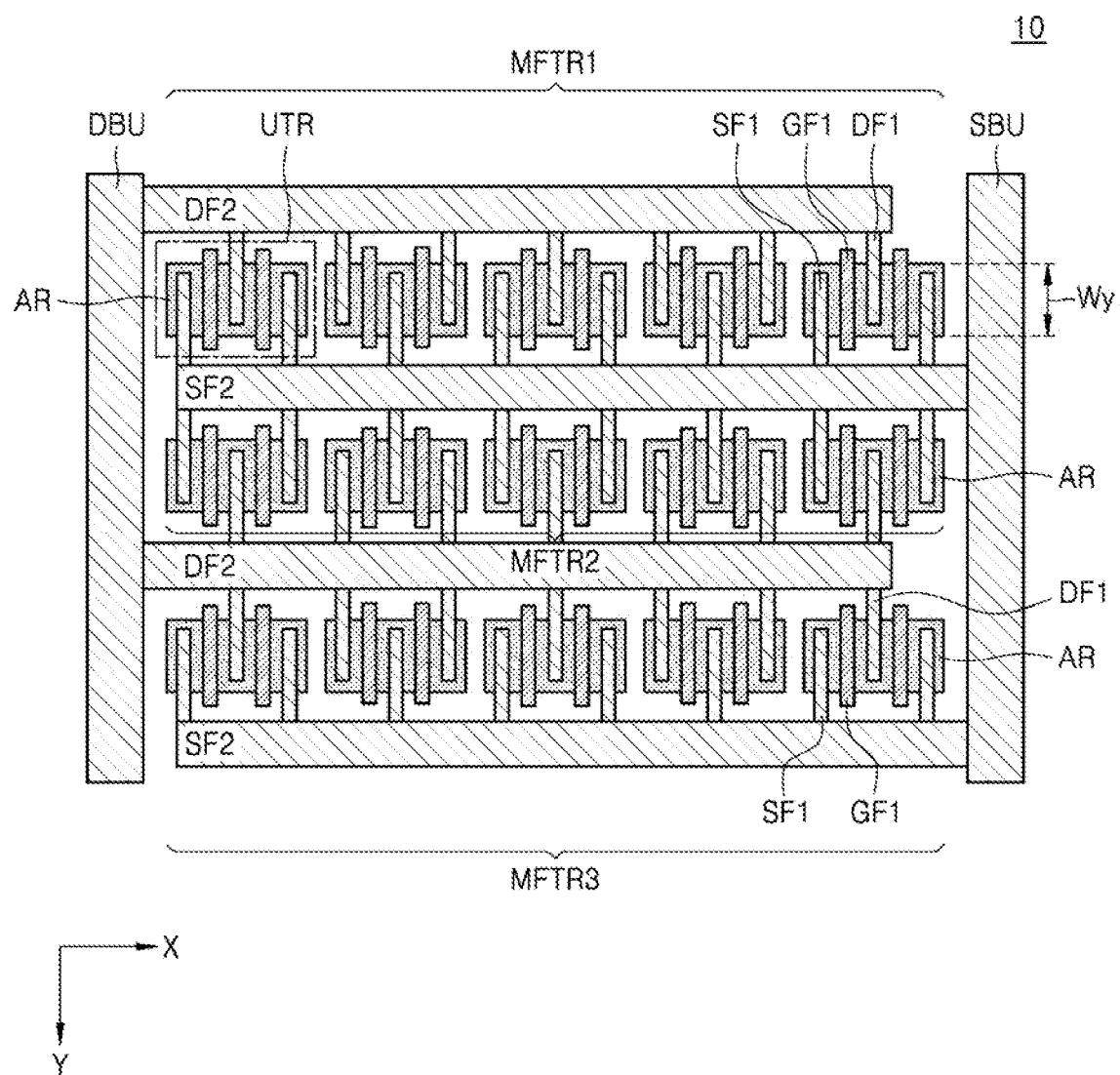
FIG. 1 is a plan view of an integrated circuit (IC) device including metal-oxide-semiconductor (MOS) transistors, according to an embodiment.

FIG. 1 is a plan view of an integrated circuit (IC) device 10 including metal-oxide-semiconductor (MOS) transistors, according to an embodiment.

In an implementation, the IC device 10 may include a radio-frequency (RF) IC device that operates in an RF band. The IC device 10 may include MOS transistors. In an implementation, the MOS transistors may include N-type MOS transistors, P-type MOS transistors, or complementary MOS (CMOS)-type transistors. The MOS transistors may be referred to as MOS field-effect transistors (FETs). As used herein, the term "or" is not an exclusive term, e.g., "A or B" would include A, B, or A and B.

The IC device 10 may include a plurality of multi-finger MOS transistors, e.g., first to third multi-finger MOS transistors MFTR1, MFTR2, and MFTR3. The first to third multi-finger MOS transistors MFTR1, MFTR2, and MFTR3 may be adopted to reduce a gate resistance of the IC device 10 (e.g., the RF IC device) and may help increase a trans-conductance gm to improve RF performance. A gate finger GF1 may be connected in parallel to each of the first to third multi-finger MOS transistors MFTR1, MFTR2, and MFTR3 to help reduce the gate resistance of the IC device 10, a resistive-capacitive (RC) delay may be reduced, and RF performance may be improved.

A channel width of each of the first to third multi-finger MOS transistors MFTR1, MFTR2, and MFTR3 may be obtained by multiplying a width Wy of an active region AR in a second direction (Y direction) by a number of gate fingers GF1. The trans-conductance of the first to third multi-finger MOS transistors MFTR1, MFTR2, and MFTR3 may be increased by increasing the width Wy of the active region AR and the number of gate fingers GF1, and RF performance may be improved.

Hereinafter, structures of the first to third multi-finger MOS transistors MFTR1, MFTR2, and MFTR3 will be described in further detail.

The first multi-finger MOS transistor MFTR1, the second multi-finger MOS transistor MFTR2, and the third multi-finger MOS transistor MFTR3 may be spaced apart from each other in the second direction (Y direction).

Each of the first to third multi-finger MOS transistors MFTR1, MFTR2, and MFTR3 may include a plurality of active regions AR, which are spaced apart from each other in a first direction (X direction) perpendicular to the second direction (Y direction). In an implementation, the active regions AR may not be spaced apart from each other in the first direction (X direction), and may be connected to each other. Each of the first to third multi-finger MOS transistors MFTR1, MFTR2, and MFTR3 may include a plurality of MOS transistors, which are spaced apart from each other in the first direction (X direction).

Each of the first to third multi-finger MOS transistors MFTR1, MFTR2, and MFTR3 may include a plurality of gate fingers GF1, which may extend (e.g., lengthwise) in the second direction (Y direction) and may be spaced apart from each other in the first direction (X direction). The gate fingers GF1 may be referred to as gate electrodes or gates.

A plurality of source fingers SF1 and a plurality of drain fingers DF1, which extend (e.g., lengthwise) in the second direction (Y direction or −Y direction) and are spaced apart from each other in the first direction (X direction), may be respectively on both, e.g., opposite, sides of the gate fingers GF1. The source fingers SF1 and the drain fingers DF1 may be respectively electrically connected to a source region and a drain region, which may be in the active region AR.

All the source fingers SF1 may be connected to a combined source finger SF2, which may extend (e.g., lengthwise) in the first direction (X direction), and all the drain fingers DF1 may be connected to a combined drain finger DF2, which may extend (e.g., lengthwise) in the first direction (X direction). The combined source finger SF2 and the combined drain finger DF2 may be spaced apart from each other in the second direction (Y direction).

The combined source finger SF2 and the combined drain finger DF2 may be symmetrically arranged with respect to the active region AR in the second direction (Y direction). In an implementation, the combined source fingers SF2 and the combined drain fingers DF2 may be alternately arranged in the second direction (Y direction), e.g., with the active region AR therebetween). The combined source finger SF2 and the combined drain finger DF2 may be respectively connected to a source bus SBU and a drain bus DBU. The source bus SBU and the drain bus DBU may be symmetrically arranged (e.g., spaced apart) in the first direction (X direction).

Each of the first to third multi-finger MOS transistors MFTR1, MFTR2, and MFTR3 may include a plurality of unit MOS transistors UTR spaced apart in the first direction (X direction). The first to third multi-finger MOS transistors MFTR1, MFTR2, and MFTR3 may include a plurality of unit MOS transistors UTR, which may be respectively spaced apart from each other in the second direction (Y direction).

The first to third multi-finger MOS transistors MFTR1, MFTR2, and MFTR3 may include array unit MOS transistors UTR, which may be arranged in the first direction (X direction) or the second direction (Y direction). The IC device 10 may include the array unit MOS transistors UTR to achieve high output.

In an implementation, one unit MOS transistor UTR may be included in the first multi-finger MOS transistor MFTR1. In FIG. 1, in the unit MOS transistor UTR, two source fingers SF1 may be on respective sides of the two gate fingers GF1, and one drain finger DF1 may be between the two gate fingers GF1. In an implementation, the unit MOS transistor UTR may include a plurality of gate fingers GF1 and source fingers SF1 and drain fingers DF1, which correspond to the plurality of gate fingers GF1.

Exemplary layout diagrams for allowing the IC device 10 including the first to third multi-finger MOS transistors MFTR1, MFTR2, and MFTR3 described above to operate with high performance and high output in an RF band will be presented below.

Figure 2:
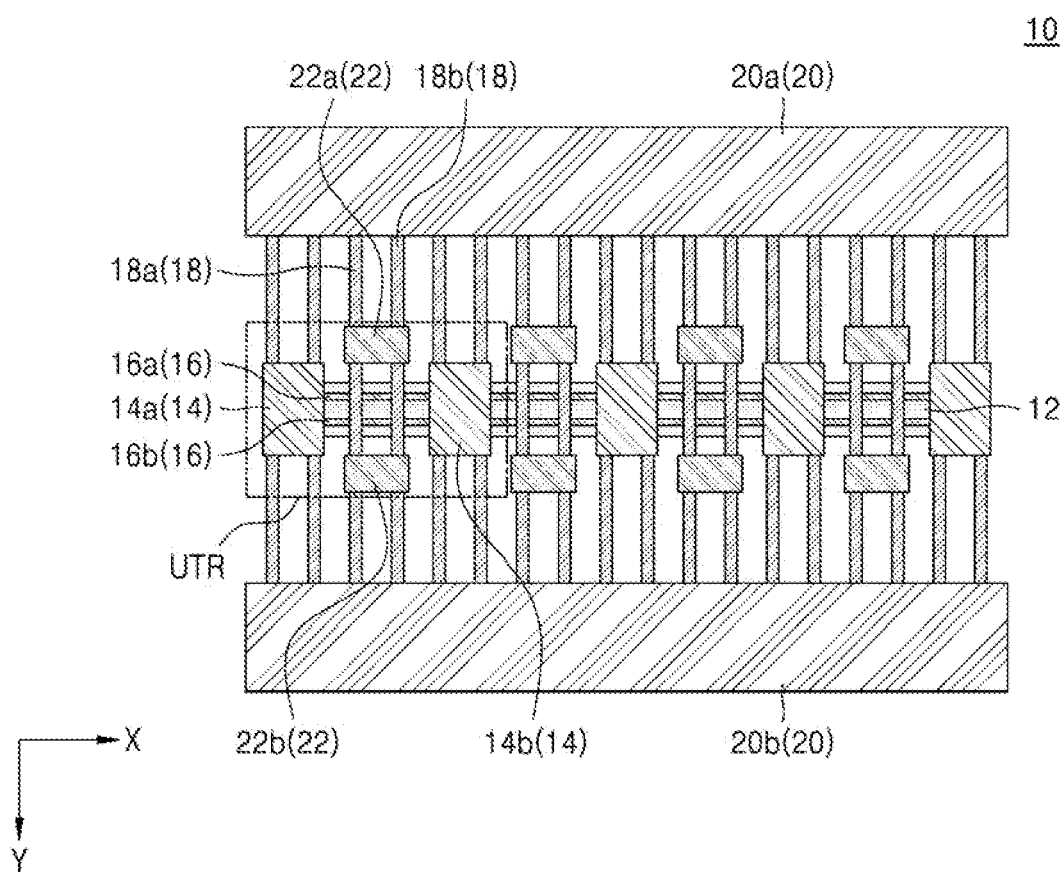
FIG. 2 is a layout diagram of an IC device including MOS transistors, according to an embodiment.
Figure 3:
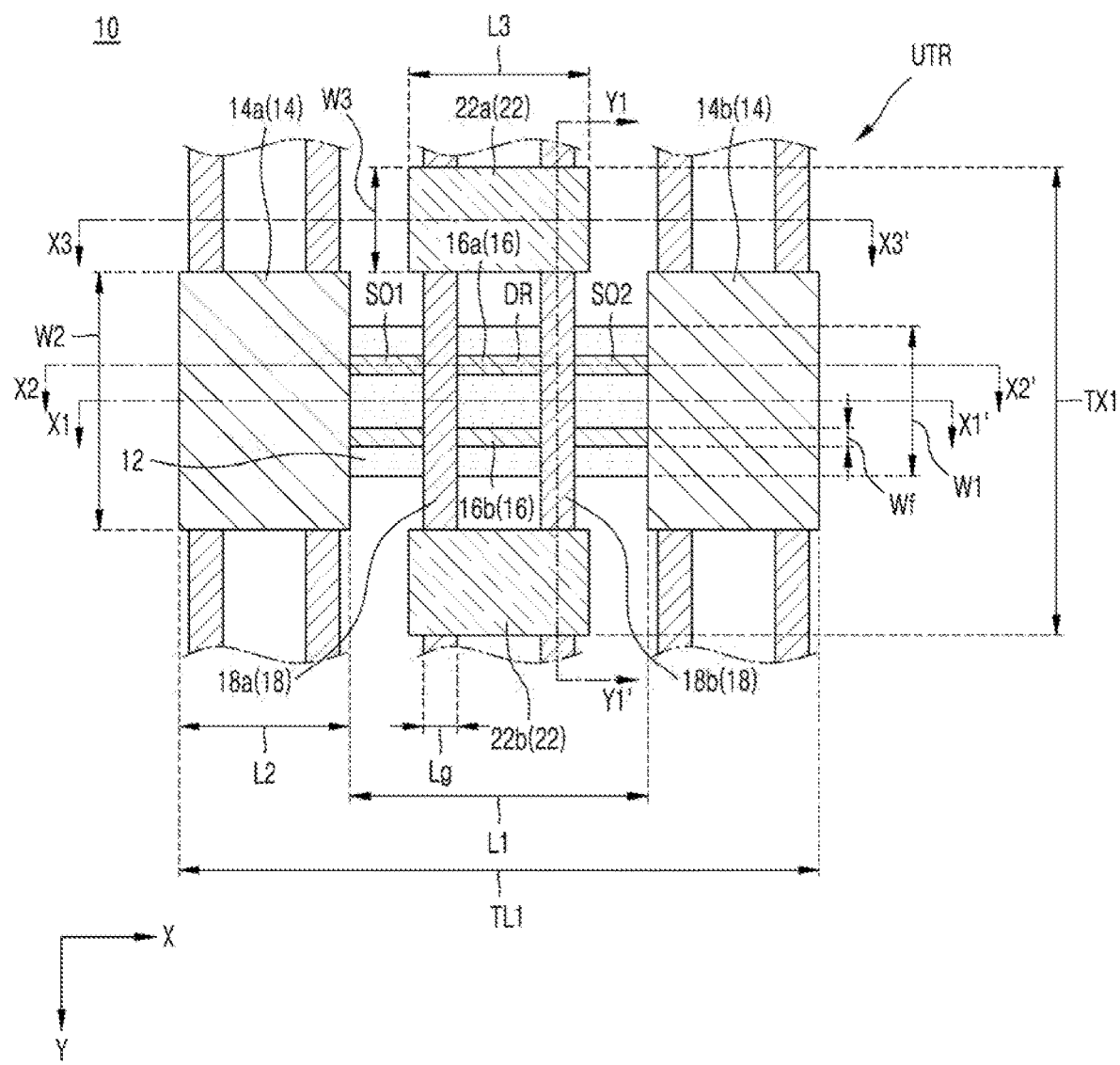
FIG. 3 is an enlarged layout diagram of a unit MOS transistor of FIG. 2.

FIG. 2 is a layout diagram of an IC device including MOS transistors, according to an embodiment. FIG. 3 is an enlarged layout diagram of a unit MOS transistor of FIG. 2.

FIG. 2 is a layout diagram of the IC device 10 described above with reference to FIG. 1. FIG. 3 is a diagram of a unit MOS transistor UTR of FIG. 2. In FIGS. 2 and 3, the description of the same components as those of FIG. 1 may be briefly presented or omitted.

The IC device 10 may include unit MOS transistors UTR, which may be spaced apart from each other in an array form in a first direction (X direction) or a second direction (Y direction). The IC device 10 may include array unit MOS transistors UTR arranged in the first direction (X direction) or the second direction (Y direction).

In FIG. 2, only unit MOS transistors UTR, which are spaced apart from each other in the first direction (X direction), are illustrated for brevity. The unit MOS transistor UTR may be a fin MOSFET device (or FinFET device). Hereinafter, the unit MOS transistor UTR will mainly be described.

The IC device 10 may include an active region 12, an active cutting region 14, a fin active pattern 16, a gate pattern 18, a combined gate cutting region 20, and an isolated gate contact region 22.

The active region 12 may extend in the first direction (X direction). In an implementation, as shown in FIG. 2, the active regions 12 may be apart from each other in the first direction (X direction). The active region 12 may correspond to the active region AR of FIG. 1.

The active region 12 may have a width W1 in the second direction (Y direction). The width W1 of the active region 12 may correspond to the width Wy of the active region AR illustrated in FIG. 1. The active region 12 may have a length L1 in the first direction (X direction). The active region 12 may be a silicon region.

The active cutting region 14 may be on a side of the active region 12 in the first direction (X direction). The active cutting region 14 may include a first active cutting region 14a and a second active cutting region 14b, which are respectively on both or opposite sides of the active region 12 in the first direction (X direction).

The active cutting region 14 may be a region in which the active region 12 is cut (e.g., separated or isolated in separate parts) in a layout. The active cutting region 14 may be a region in which a gate pattern 18 is not formed, e.g., an insulating region. The insulating region may include a silicon oxide layer or a silicon nitride layer. The active cutting region 14 may have a length L2 in the first direction (X direction). The active cutting region 14 may have a width W2 in the second direction (Y direction). In an implementation, the width W2 of the active cutting region 14 may be greater than the width W1 of the active region 12.

The fin active pattern 16 may extend in the first direction (X direction) on the active region 12. In an implementation, the fin active pattern 16 may include a first fin active pattern 16a and a second fin active pattern 16b, which may be spaced apart from each other in the second direction (Y direction). The fin active pattern 16 may be a fin region. The fin active pattern 16 may include a silicon (Si) layer.

The fin active pattern 16 may include a first source region SO1, a drain region DR, and a second source region SO2, e.g., aligned along or in the first direction (X direction). The first source region SO1, the drain region DR1, and the second source region SO2 may include a silicon layer including impurities. The fin active pattern 16 may (e.g., each) have a width Wf in the second direction (Y direction).

The source fingers SF1 described with reference to FIG. 1 may be electrically connected to the first source region SO1 and the second source region SO2. The drain finger DF1 described with reference to FIG. 1 may be connected to the drain region DR1.

The gate pattern 18 may extend across the active region 12 and the fin active pattern 16 in the second direction (Y direction) perpendicular to the first direction (X direction). As shown in FIG. 2, the gate pattern 18 may include a plurality of conductive patterns, which extend in the second direction (Y direction) and may be spaced apart from each other in the first direction (X direction). The gate pattern 18 may not be located in or on the active cutting region 14.

The gate pattern 18 may have a gate length Lg in the first direction (X direction). The gate pattern 18 may correspond to the gate finger GF1 of FIG. 1. The gate pattern 18 may be referred to as a gate electrode or a gate. The gate pattern 18 may include a conductive layer, e.g., a metal layer. In an implementation, the gate pattern 18 may include a doped polysilicon layer.

The gate pattern 18 may intersect with the active region 12 and the fin active pattern 16 over or on the active region 12, and may extend to the outside of the active region 12. In an implementation, the gate pattern 18 may include a first gate pattern 18a and a second gate pattern 18b, which may be spaced apart from each other in the first direction (X direction).

The combined gate cutting regions 20 may be on or at both or opposite sides of the gate pattern 18 in the second direction (Y direction). The combined gate cutting region 20 may be a region in or at which a plurality of gate patterns 18 are cut. The combined gate cutting region 20 may include an insulating region, e.g., a silicon oxide layer region or a silicon nitride layer region. The combined gate cutting region 20 may include a first combined gate cutting region 20a and a second combined gate cutting region 20b, which are apart from each other in the second direction (Y direction).

The isolated gate contact region 22 may be in contact (e.g., direct contact) with the gate pattern 18 outside the active region 12. The isolated gate contact region 22 may include a conductive region. The isolated gate contact region 22 may include a metal layer or a doped silicon layer.

In an implementation, the isolated gate contact region 22 may include a first isolated gate contact region 22a and a second isolated gate contact region 22b, which may be respectively on opposite sides of the active region 12 in the second direction (Y direction). The isolated gate contact region 22 may have a length L3 in the first direction (X direction). The isolated gate contact region 22 may have a width W3 in the second direction (Y direction). The isolated gate contact region 22 may be in contact with or include both the first isolated gate contact region 22a and the second isolated gate contact region 22b.

In an implementation, as illustrated in FIGS. 2 and 3, the unit MOS transistor UTR of the IC device 10 may include two gate patterns 18 and two fin active patterns 16. In an implementation, as shown in FIG. 3, the unit MOS transistor UTR of the IC device 10 may have a total length TL1 in the first direction (X direction) and a total width TX1 in the second direction (Y direction). The total length TL1 may be determined by the gate length Lg of the gate pattern 18, the number of gate patterns 18, the length L1 of the active region 12, the length L2 of the active cutting region 14, and the length L3 of the isolated gate contact region 22.

In an implementation, the total length TL1 of the unit MOS transistor UTR in the first direction (X direction) may be determined by the number of gate patterns 18. The total width TX1 of the unit MOS transistor UTR in the second direction (Y direction) may be determined by the width W1 of the active region 12, the width W2 of the active cutting region 14, and the width W3 of the isolated gate contact region 22.

In an implementation, the width W1 of the active region 12 may be in a range of about 0.08 μm to about 0.35 μm an implementation, the width W2 of the active cutting region 14 may be in a range of about 0.12 μm to about 0.38 μm an implementation, the width W3 of the isolated gate contact region 22 may be in a range of about 0.03 μm to about 0.07 μm.

In an implementation, the length L1 of the active region 12 may be in a range of about 0.16 μm to about 0.24 μm an implementation, the length L2 of the active cutting region 14 may be in a range of about 0.06 μm to about 0.09 μm an implementation, the length L3 of the isolated gate contact region 22 may be in a range of about 0.12 μm to about 0.22 μm.

In an implementation, the total length TL1 of the unit MOS transistor UTR may be in a range of about 0.28 μm to about 0.42 μm an implementation, the total width TX1 of the unit MOS transistor UTR may be in a range of about 0.18

μm to about 0.52 μm. In an implementation, an area of the unit MOS transistor UTR may be in a range of about 0.05 μm² to about 0.22 μm². The sizes of the unit MOS transistor UTR may vary.

In the IC device 10 described above, the unit MOS transistor UTR may include the active cutting region 14 in which the gate pattern 18 is not located, on one side of the active region 12. Thus, the IC device 10 may help reduce parasitic resistance between the gate patterns 18 in the unit transistor UTR.

In addition, the IC device 10 may include the isolated gate contact region 22, which is in contact with the gate pattern 18 outside the active region 12 in the unit MOS transistor UTR. As described above, the isolated gate contact region 22 may have a length L3 in the first direction (X direction) or a width W3 in the second direction (Y direction).

The length L3 or the width W3 of the isolated gate contact region 22 may be set to great values according to design rules. Thus, the unit MOS transistor UTR of the IC device 10 may reduce a parasitic resistance (e.g., contact resistance) of the isolated gate contact region contact region 22.

The IC device 10 may help reduce various parasitic resistances of the unit MOS transistor UTR to help improve RF performance indicators, e.g., a cut-off frequency $f_T$ and a maximum vibration frequency $f_{MAX}$, thereby achieving high performance. In an implementation, in the IC device 10, the unit MOS transistors UTR may be arranged in an array form in the first direction (X direction) or the second direction (Y direction) to achieve high output.

FIGS. 4 to 7 are cross-sectional views of the unit MOS transistor of FIG. 3, which are taken in a first direction (X direction) and a second direction (Y direction).

Figure 4:
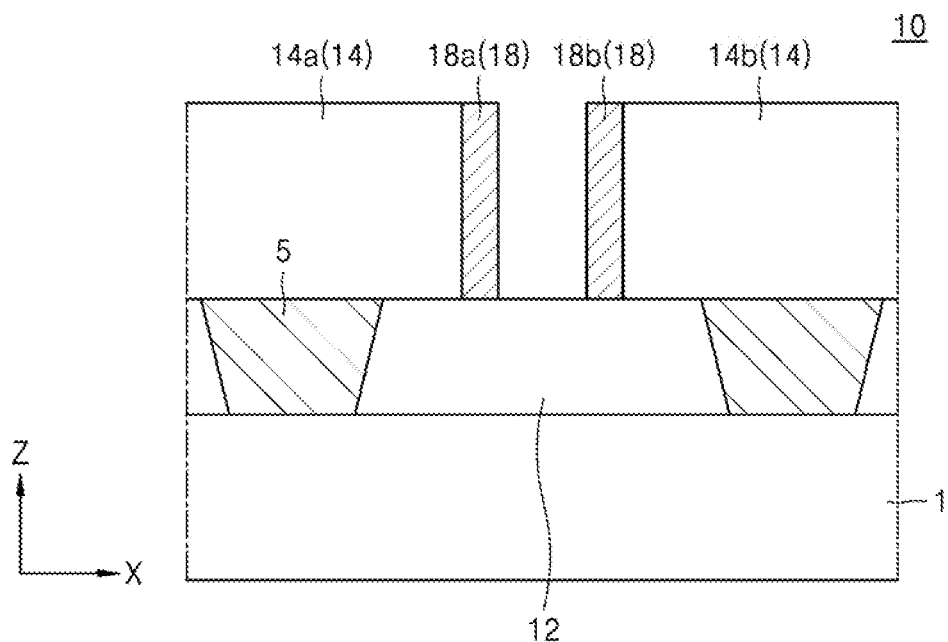
FIGS. 4 to 7 are cross-sectional views of the unit MOS transistor of FIG. 3, which are taken in a first direction (X direction) and a second direction (Y direction)
Figure 5:
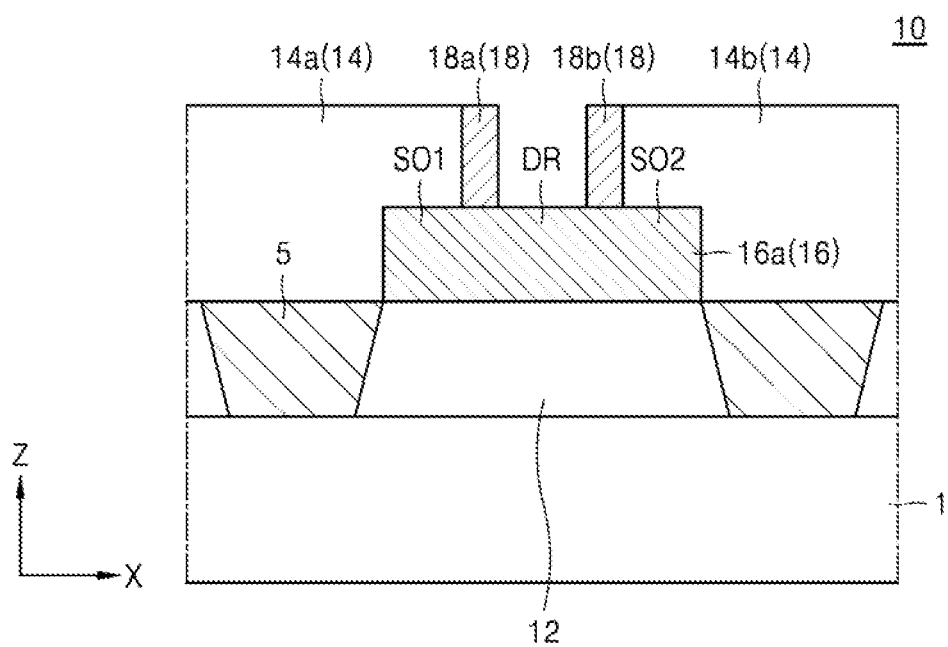
Figure 6:
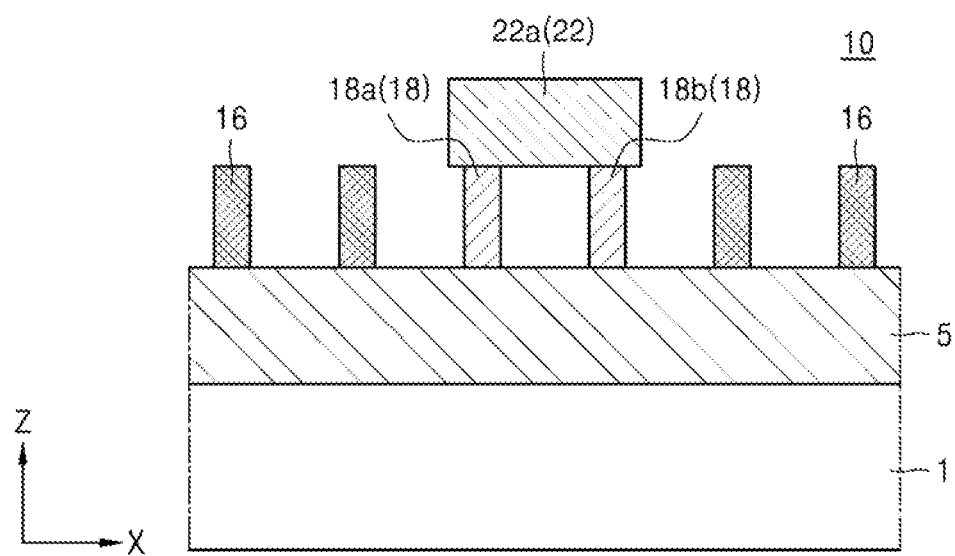
Figure 7:
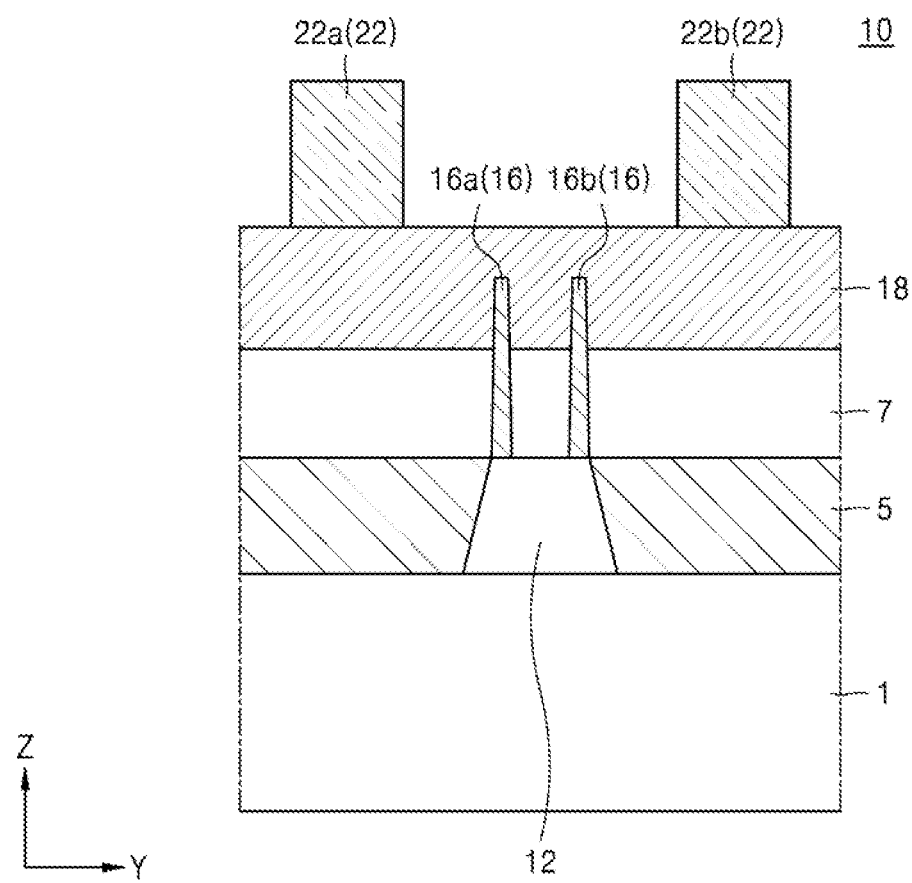

FIG. 4 is a cross-sectional view taken along line X1-X1' of FIG. 3. FIG. 5 is a cross-sectional view taken along line X2-X2' of FIG. 3. FIG. 6 is a cross-sectional view taken along line X3-X3' of FIG. 3. FIG. 7 is a cross-sectional view taken along line Y1-Y1' of FIG. 3.

An IC device 10 may include an active region 12 and a device isolation region 5, which are on a semiconductor substrate 1. The semiconductor substrate 1 may include a silicon substrate. A region other than the active region 12 on the semiconductor substrate 1 may be the device isolation region 5. The active region 12 may include a silicon layer. The device isolation region 5 may include a silicon oxide layer or a silicon nitride layer.

As shown in FIGS. 5 and 7, a fin active pattern 16 may be on the active region 12. As shown in FIG. 7, the fin active pattern 16 may include a first fin active pattern 16a and a second fin active pattern 16b, which may be spaced apart from each other in the second direction (Y direction). The fin active pattern 16 may include the same material as the active region 12.

As shown in FIG. 5, the fin active pattern 16 may include a first source region SO1, a drain region DR, and a second source region SO2, e.g., sequentially aligned or arranged along or in the first direction (X direction). The first source region SO1, the drain region DR, and the second source region SO2 may each include a silicon layer including impurities.

As shown in FIGS. 4, 5, and 7, a gate pattern 18 may be on the fin active pattern 16. As shown in FIG. 7, the gate pattern 18 may surround an upper portion of the fin active pattern 16. As shown in FIGS. 4, 5, and 6, the gate pattern 18 may include a first gate pattern 18a and a second gate pattern 18b, which may be spaced apart from each other in the first direction (X direction).

As shown in FIGS. 4 and 5, active cutting regions 14 may be on opposite sides of the gate pattern 18. The active cutting region 14 may include a first active cutting region 14a and a second active cutting region 14b, which may be spaced apart from each other in the first direction (X direction).

The active cutting region 14 may be a region (e.g., an insulating region) in which the gate pattern 18 is not formed. The active cutting region 14 may include a silicon oxide layer or a silicon oxide layer. As described above, the IC device 10 may include the active cutting region 14 in which the gate pattern 18 is not located or not included, and may help reduce a parasitic resistance between the gate patterns 18.

As shown in FIGS. 6 and 7, an isolated gate contact region 22 may be on the gate pattern 18 and in contact with the gate pattern 18. As shown in FIG. 7, the isolated gate contact region 22 may include a first isolated gate contact region 22a and a second isolated gate contact region 22b, which may be spaced apart from each other in the second direction (Y direction). In the IC device 10 described above, a length (refer to L3 in FIG. 3) of the isolated gate contact region 22 in the first direction (X direction) or a width (refer to W3 in FIG. 3) of the isolated gate contact region 22 in the second direction (Y direction) may be set to relatively great values according to design rules, and thus, parasitic resistance (e.g., contact resistance) may be reduced.

Figure 8:
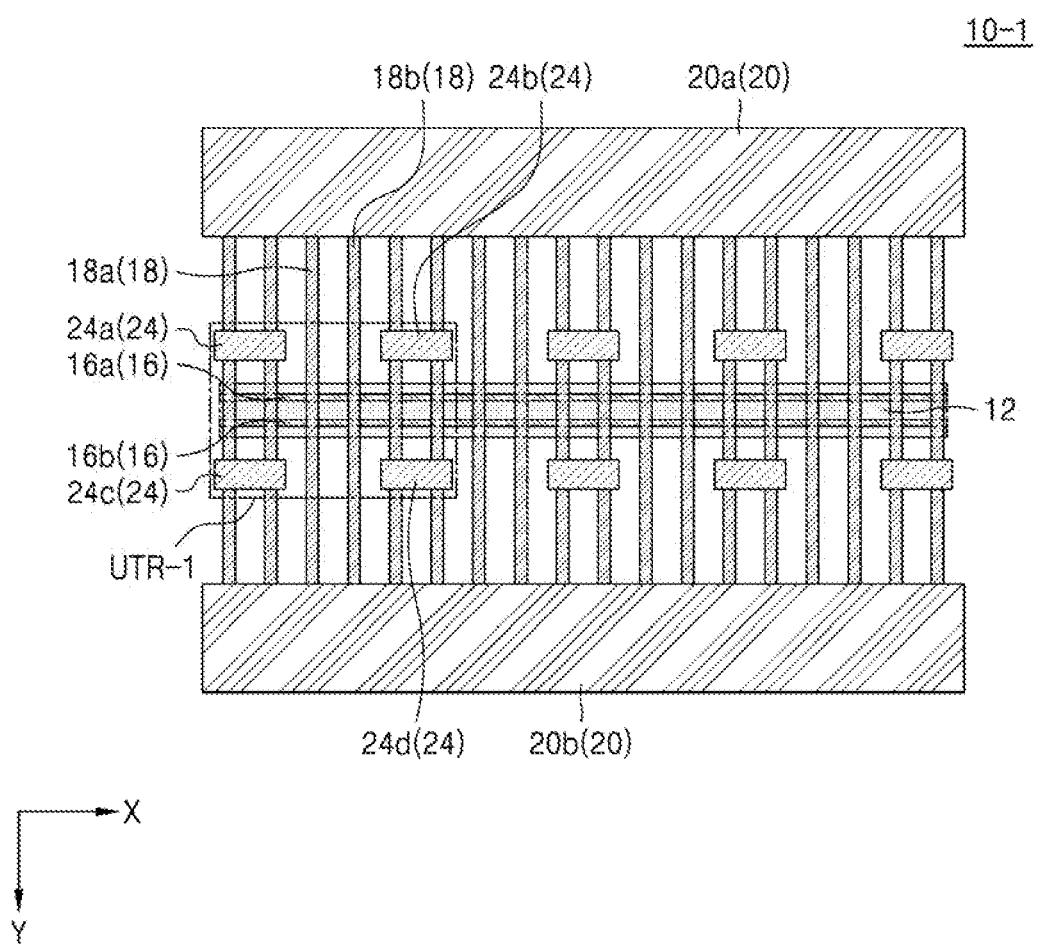
FIG. 8 is a layout diagram of an IC device including MOS transistors, according to an embodiment.
Figure 9:
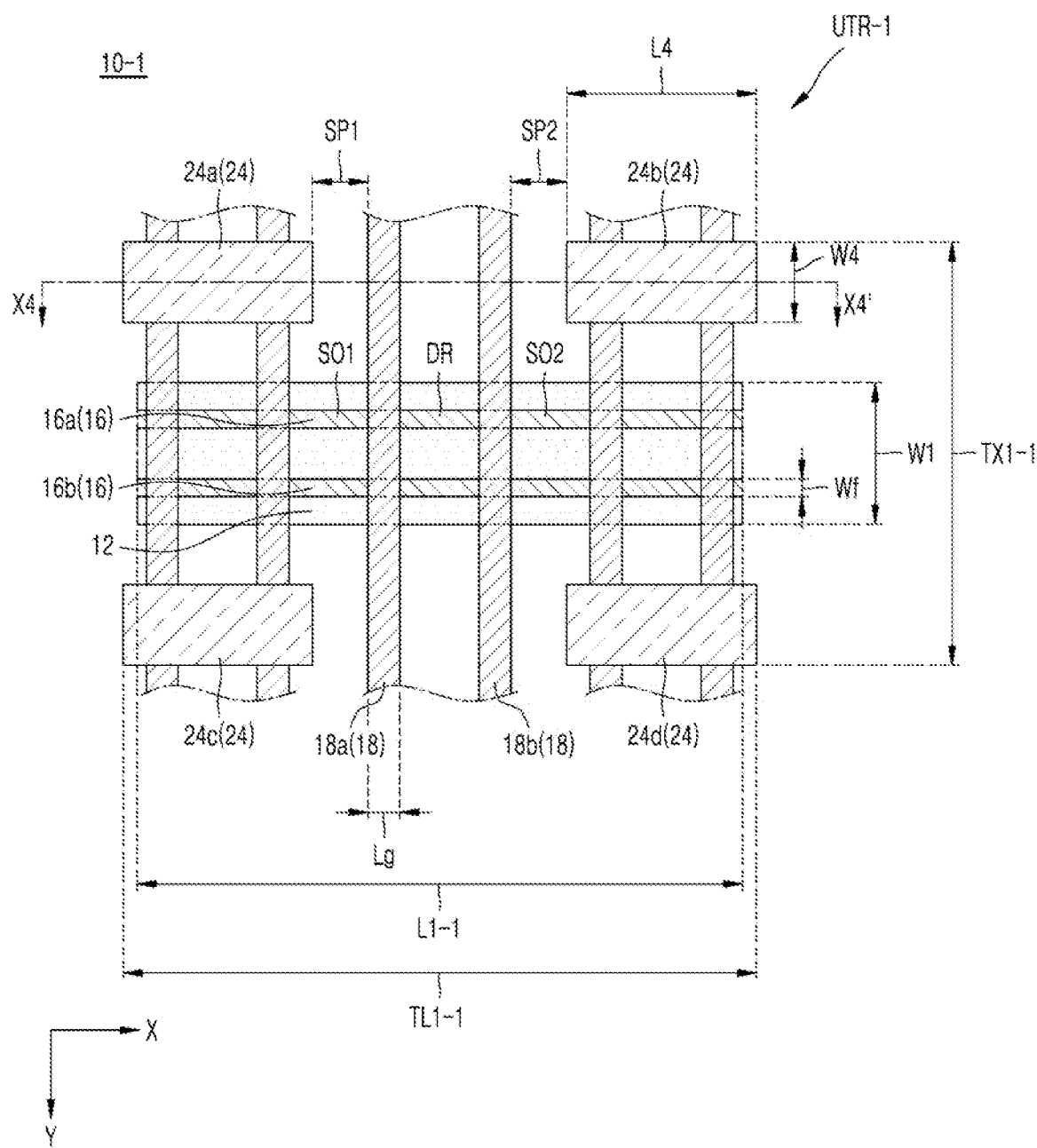
FIG. 9 is an enlarged layout diagram of a unit MOS transistor of FIG. 8.
Figure 10:
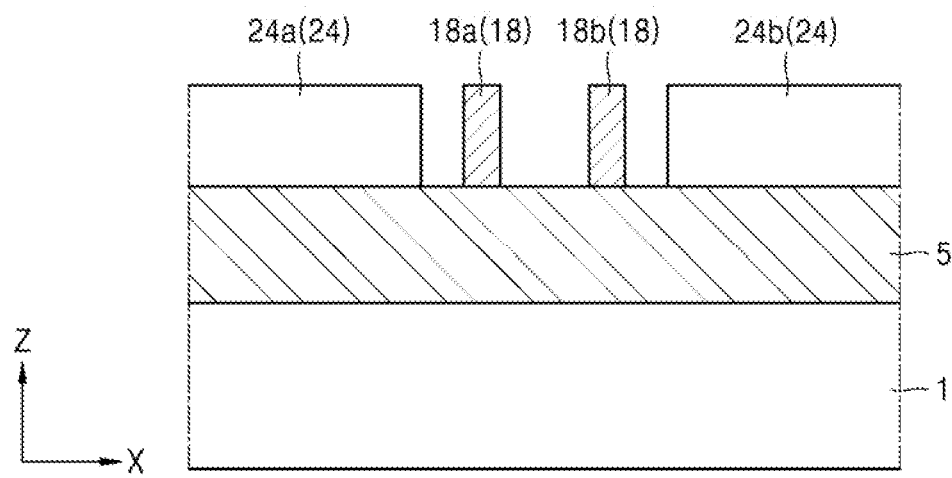
FIG. 10 is a cross-sectional view of the unit MOS transistor of FIG. 9, which is taken in a first direction (X direction)

FIG. 8 is a layout diagram of an IC device 10-1 including MOS transistors, according to an embodiment. FIG. 9 is an enlarged layout diagram of a unit MOS transistor of FIG. 8. FIG. 10 is a cross-sectional view of the unit MOS transistor of FIG. 9, which is taken in a first direction (X direction).

FIG. 10 is a cross-sectional view taken along line X4-X4' of FIG. 9. The IC device 10-1 of FIGS. 8 to 10 may be the same as the IC device 10 of FIGS. 2 to 7 except that the IC device 10-1 of FIGS. 8 to 10 may not include the active cutting region (refer to 14 in FIGS. 2, 3, 4, and 5) and the isolated gate contact region (refer to 22 in FIGS. 2, 3, 6, and 7), and may include a gate cutting region 24.

In FIGS. 8 to 10, the same reference numerals are used to denote the same elements as in FIGS. 2 to 7. In FIGS. 8 to 10, the description of the same components as those of FIGS. 2 to 7 may be omitted or briefly described. The IC device 10-1 may include unit MOS transistors UTR-1. Hereinafter, the unit MOS transistor UTR-1 will mainly be described.

The IC device 10-1 may include an active region 12, a fin active pattern 16, a gate pattern 18, a combined gate cutting region 20, and the gate cutting region 24.

The active region 12 may extend in the first direction (X direction). The active region 12 may have a width W1 in a second direction (Y direction). The active region 12 may have a length L1-1 in the first direction (X direction). The length L1-1 of the active region 12 of FIG. 9 may be greater than the length L1 of the active region L1 of FIG. 3.

The fin active pattern 16 may extend in the first direction (X direction) on the active region 12. In an implementation, the fin active pattern 16 may include a first fin active pattern 16a and a second fin active pattern 16b, which may be spaced apart from each other in the second direction (Y direction).

The fin active pattern 16 may include a first source region SO1, a drain region DR, and a second source region SO2, e.g., along the first direction (X direction). The fin active pattern 16 may have a width Wf in the second direction (Y direction).

The gate pattern 18 may extend across the active region 12 and the fin active pattern 16 in the second direction (Y direction) perpendicular to the first direction (X direction). The gate pattern 18 may be on a device isolation region 5 of a semiconductor substrate 1 in the cross-sectional view of FIG. 10. The gate pattern 18 may have a gate length Lg in the first direction (X direction). The gate pattern 8 may also be in or on the isolated gate contact region 22 of FIGS. 2 and 3.

The gate pattern 18 may intersect with the active region 12 and the fin active pattern 16 over or on the active region 12 and the fin active pattern 16 and may extend to the outside of the active region 12. In an implementation, the gate pattern 18 may include a first gate pattern 18a and a second gate pattern 18b, which may be spaced apart from each other in the first direction (X direction).

The combined gate cutting regions 20 may be on opposite sides of the gate pattern 18 in the second direction (Y direction). The combined gate cutting region 20 may be a region in which a plurality of gate patterns 18 are cut. The combined gate cutting region 20 may be an insulating region. The combined gate cutting region 20 may include a first combined gate cutting region 20a and a second combined gate cutting region 20b, which may be spaced apart from each other in the second direction (Y direction).

The gate cutting region 24 may be around the active region 12 and the fin active pattern 16. The gate cutting region 24 may be spaced apart from the gate pattern 18 on one side of the gate pattern 18 in the first direction (X direction).

The gate cutting regions 24 may be located distances SP1 and SP2 apart from the gate pattern 18 on opposite sides of the gate pattern 18 in the first direction (X direction). As shown in FIG. 10, the gate cutting region 24 may be spaced apart from the gate pattern 18 in the first direction (X direction). The gate cutting region 24 may be a region in which the gate pattern 18 is not located. The gate cutting region 24 may be an insulating region. The gate cutting region 24 may include a silicon oxide layer or a silicon nitride layer.

The gate cutting region 24 may include a first gate cutting region 24a and a second gate cutting region 24b, which may be above the active region 12 and the fin active pattern 16 and may be spaced apart from the gate pattern 18 on opposite sides of the gate pattern 18 in the first direction (X direction).

The gate cutting region 24 may include a third gate cutting region 24c and a fourth gate cutting region 24d, which may be below the active region 12 and the fin active pattern 16 and respectively symmetrical to the first gate cutting region 24a and the second gate cutting region 24b in the second direction (Y direction).

The first gate cutting region 24a and the third gate cutting region 24c may be located the distance SP1 apart from the first gate pattern 18a. The second gate cutting region 24b and the fourth gate cutting region 24d may be located the distance SP2 apart from the second gate pattern 18b. The gate cutting region 24 may have a length L4 in the first direction (X direction). The gate cutting region 24 may have a width W4 in the second direction (Y direction).

The gate cutting region 24 may apply stress (e.g., tensile stress) to the unit MOS transistor UTR-1. When stress is applied to the unit MOS transistor UTR-1, a trans-conductance gm may be increased.

The unit MOS transistor UTR of the IC device 10-1 may include two gate patterns 18 and two fin active patterns 16. As shown in FIG. 9, the unit MOS transistor UTR-1 of the IC device 10-1 may have a total length TL1-1 in the first direction (X direction) and a total width TX1-1 in the second direction (Y direction).

The total length TL1-1 may be determined by the gate length Lg of the gate pattern 18, the number of gate patterns 18, and the length L4 of the gate cutting region 24. The total width TX1-1 may be determined by the width W1 of the active region 12, the width W4 of the gate cutting region 24, and a distance between gate cutting regions 24.

In an implementation, the width W4 of the gate cutting region 24 may be in a range of about 0.02 μm to about 0.06 μm. In an implementation, the length L1-1 of the active region 12 may be in a range of about 0.28 μm to about 0.42 μm. In an implementation, the length L4 of the gate cutting region 24 may be in a range of about 0.07 μm to about 0.10 μm.

In an implementation, the total length TL1-1 of the unit MOS transistor UTR-1 may be in a range of about 0.30 μm to about 0.44 μm. In an implementation, the total width TX1 of the unit MOS transistor UTR-1 may be in a range of about 0.18 μm to about 0.52 μm. In an implementation, an area of the unit MOS transistor UTR-1 may be in a range of about 0.05 μm² to about 0.23 μm². The sizes of the unit MOS transistor UTR-1 may vary.

In the IC device 10-1 described above, the unit MOS transistor UTR-1 may include the gate cutting region 24 in which the gate pattern 18 is not located, around the active region 12. Thus, the IC device 10-1 may increase a trans-conductance gm by applying a stress effect (i.e., tensile stress) to the unit transistor UTR-1.

The IC device 10-1 may help increase a trans-conductance of the unit MOS transistor UTR-1 to improve RF performance indicators, e.g., a cut-off frequency $f_T$ and a maximum vibration frequency $f_{MAX}$, thereby achieving high performance. In an implementation, in the IC device 10-1, the unit MOS transistors UTR-1 may be arranged in an array form in the first direction (X direction) or the second direction (Y direction) to achieve high output.

Figure 11:
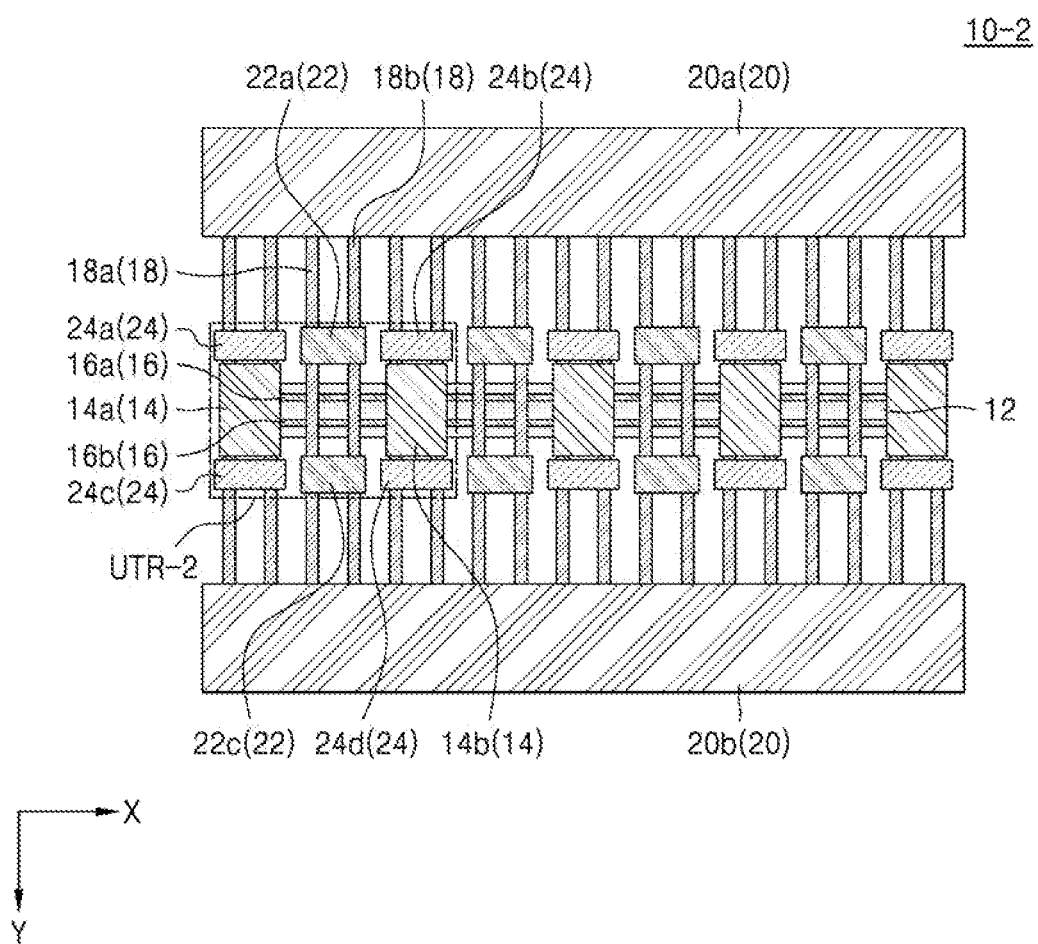
FIG. 11 is a layout diagram of an IC device including MOS transistors, according to an embodiment.
Figure 12:
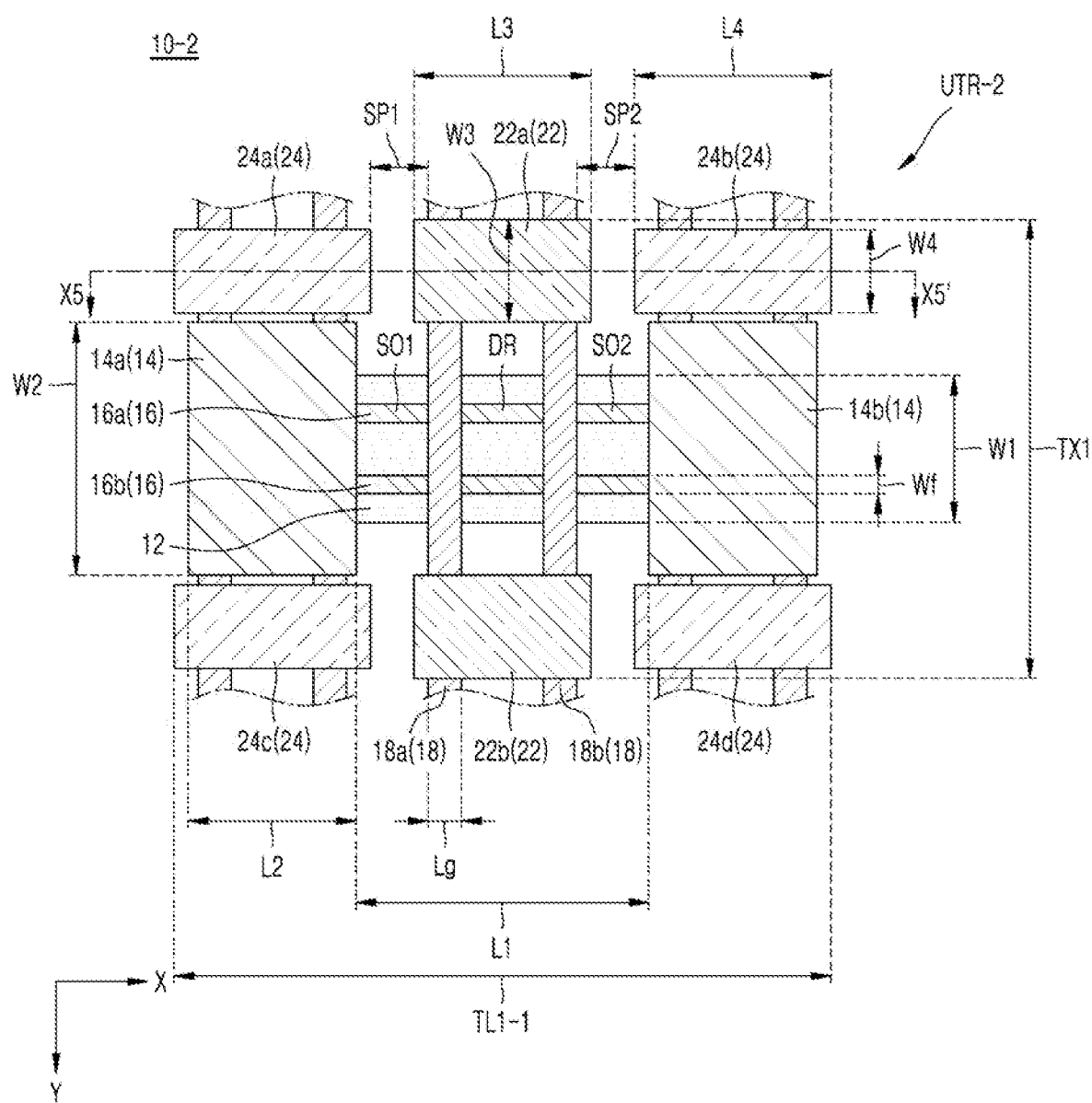
FIG. 12 is an enlarged layout diagram of a unit MOS transistor of FIG. 10.
Figure 13:
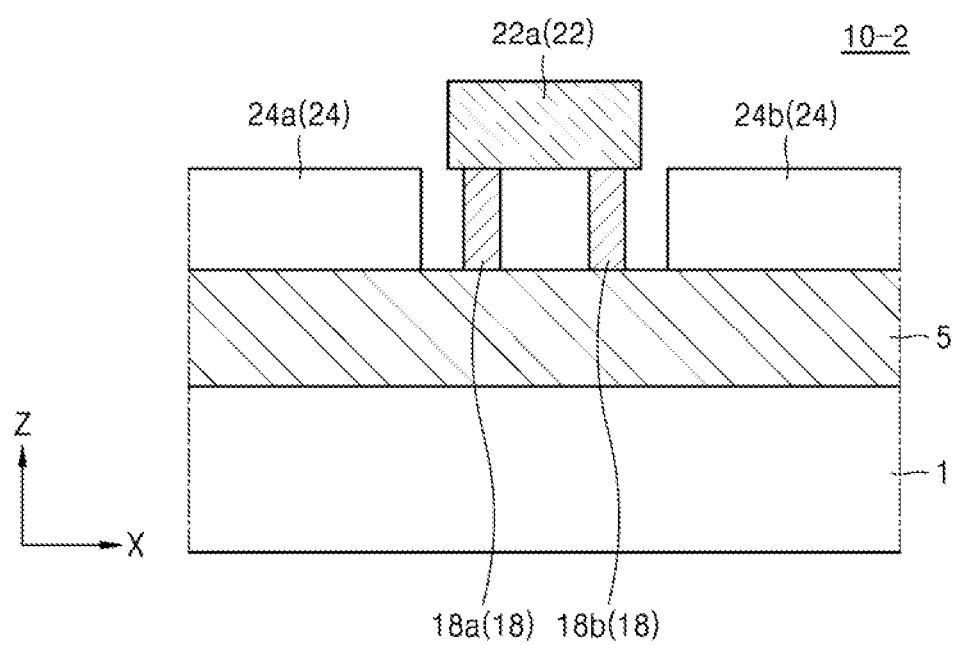
FIG. 13 is a cross-sectional view of the unit MOS transistor of FIG. 12, which is taken in a first direction (X direction)

FIG. 11 is a layout diagram of an IC device 10-2 including MOS transistors, according to an embodiment. FIG. 12 is an enlarged layout diagram of a unit MOS transistor of FIG. 10. FIG. 13 is a cross-sectional view of the unit MOS transistor of FIG. 12, which is taken in a first direction (X direction).

FIG. 13 is a cross-sectional view taken along line X5-X5' of FIG. 12. The IC device 10-2 of FIGS. 11 to 13 may correspond to a combination of the IC device 10 of FIGS. 2 to 7 and the IC device 10-1 of FIGS. 8 to 10. In other words, the IC device 10-2 of FIGS. 11 to 13 may be the same as the IC device 10 of FIGS. 2 to 7 except that the IC device 10-2 further includes a gate cutting region 24.

In FIGS. 11 to 13, the same reference numerals are used to denote the same elements as in FIGS. 2 to 7 and FIGS. 8 to 10. In FIGS. 11 to 13, the description of the same components as those of FIGS. 2 to 7 and FIGS. 8 to 10 may be briefly presented or omitted. The IC device 10-2 may include unit MOS transistors UTR-2. Hereinafter, the unit MOS transistor UTR-2 will mainly be described.

The IC device 10-2 may include an active region 12, an active cutting region 14, a fin active pattern 16, a gate pattern 18, a combined gate cutting region 20, an isolated gate contact region 22, and a gate cutting region 24.

The active region 12 may extend in the first direction (X direction). As shown in FIG. 11, the active regions 12 may be spaced apart from each other in the first direction (X direction). The active region 12 may have a width W1 in the second direction (Y direction). The active region 12 may have a length L1 in the first direction (X direction).

The active cutting region 14 may be on one side or on sides of the active region 12 in the first direction (X direction). The active cutting region 14 may be an insulating region. The active cutting region 14 may include a first active cutting region 14a and a second active cutting region 14b, which may be respectively on opposite sides of the active region 12 in the first direction (X direction). The active cutting region 14 may have a length L2 in the first direction (X direction). The active cutting region 14 may have a width W2 in the second direction (Y direction).

The fin active pattern 16 may extend in the first direction (X direction) on the active region 12. The fin active pattern 16 may include a first fin active pattern 16a and a second fin active pattern 16b, which may be spaced apart from each other in the second direction (Y direction).

The fin active pattern 16 may include a first source region SOL a drain region DR, and a second source region SO2, e.g., along the first direction (X direction). The fin active pattern 16 may have a width Wf in the second direction (Y direction).

The gate pattern 18 may extend across the active region 12 and the fin active pattern 16 in the second direction (Y direction) perpendicular to the first direction (X direction). The gate pattern 18 may be on a device isolation region 5 of a semiconductor substrate 1 in the cross-sectional view of FIG. 13.

The gate pattern 18 may have a gate length Lg in the first direction (X direction). The gate pattern 18 may include a first gate pattern 18a and a second gate pattern 18b, which may be spaced apart from each other in the first direction (X direction).

The combined gate cutting regions 20 may be on opposite sides of the gate pattern 18 in the second direction (Y direction). The combined gate cutting region 20 may be a region in which a plurality of gate patterns 18 are cut. The combined gate cutting region 20 may be an insulating region. The combined gate cutting region 20 may include a first combined gate cutting region 20a and a second combined gate cutting region 20b, which may be spaced apart from each other in the second direction (Y direction).

The isolated gate contact region 22 may be in contact with the gate pattern 18 outside the active region 12. The isolated gate contact region 22 may be a conductive region. The isolated gate contact region 22 may include a first isolated gate contact region 22a and a second isolated gate contact region 22b, which may be respectively on opposite sides of the active region 12 in the second direction (Y direction). The isolated gate contact region 22 may have a length L3 in the first direction (X direction). The isolated gate contact region 22 may have a width W3 in the second direction (Y direction).

The gate cutting region 24 may be around the active region 12 and the fin active pattern 16. The gate cutting region 24 may be spaced apart from the gate pattern 18 on a side of the gate pattern 18 in the first direction (X direction). The gate cutting regions 24 may be located distances SP1 and SP2 apart from the gate pattern 18 on opposite sides of the gate pattern 18 in the first direction (X direction).

As shown in FIG. 12, the gate cutting region 24 may be spaced apart from the gate pattern 18 in the first direction (X direction). The gate cutting region 24 may be an insulating region in or at which the gate pattern 18 is not located. The gate cutting region 24 may include a first gate cutting region 24a, a second gate cutting region 24b, a third gate cutting region 24c, and a fourth gate cutting region 24d.

The first gate cutting region 24a and the third gate cutting region 24c may each be spaced the distance SP1 apart from the first gate pattern 18a. The second gate cutting region 24b and the fourth gate cutting region 24d may each be spaced the distance SP2 apart from the second gate pattern 18b. The gate cutting region 24 may have a length L4 in the first direction (X direction). The gate cutting region 24 may have a width W4 in the second direction (Y direction).

The unit MOS transistor UTR-2 of the IC device 10-2 may include two gate patterns 18 and two fin active patterns 16. As shown in FIG. 12, the unit MOS transistor UTR-2 of the IC device 10-2 may have a total length TL1-1 in the first direction (X direction) and a total width TX1 in the second direction (Y direction).

The total length TL1-1 may be determined by the length L1 of the active region 12, the gate length Lg of the gate pattern 18, the number of gate patterns 18, the length L2 of the active cutting region 14, the length L3 of the isolated gate contact region 22, and the length L4 of the gate cutting region 24. The total width TX1 may be determined by the width W1 of the active region 12, the width W2 of the active cutting region 14, the width W3 of the isolated gate contact region 22, and the width W4 of the gate cutting region 24.

As described above, the IC device 10-2 may include the active cutting region 14 in which the gate pattern 18 is not located. Thus, the IC device 10-2 may help reduce parasitic resistance between the gate patterns 18 in the unit transistor UTR-2.

In the IC device 10-2, the length L3 or the width W3 of the isolated gate contact region 22 may be set to relatively great values according to design rules. Thus, the unit MOS transistor UTR-2 of the IC device 10-2 may help reduce parasitic resistance (e.g., contact resistance) of the gate contact region 22.

In addition, in the IC device 10-2, the gate cutting region 24 may apply stress (e.g., tensile stress) to the unit MOS transistor UTR-2. When stress is applied to the unit MOS transistor UTR-2, a trans-conductance gm may be increased.

The IC device 10-2 may help reduce a parasitic resistance of the unit MOS transistor UTR-2 or increase a trans-conductance of the unit MOS transistor UTR-2 to improve RF performance indicators, e.g., a cut-off frequency $f_T$ and a maximum vibration frequency $f_{MAX}$, thereby achieving high performance. In an implementation, in the IC device 10-2, the unit MOS transistors UTR-2 may be arranged in an array form in the first direction (X direction) or the second direction (Y direction) to achieve high output.

Figure 14:
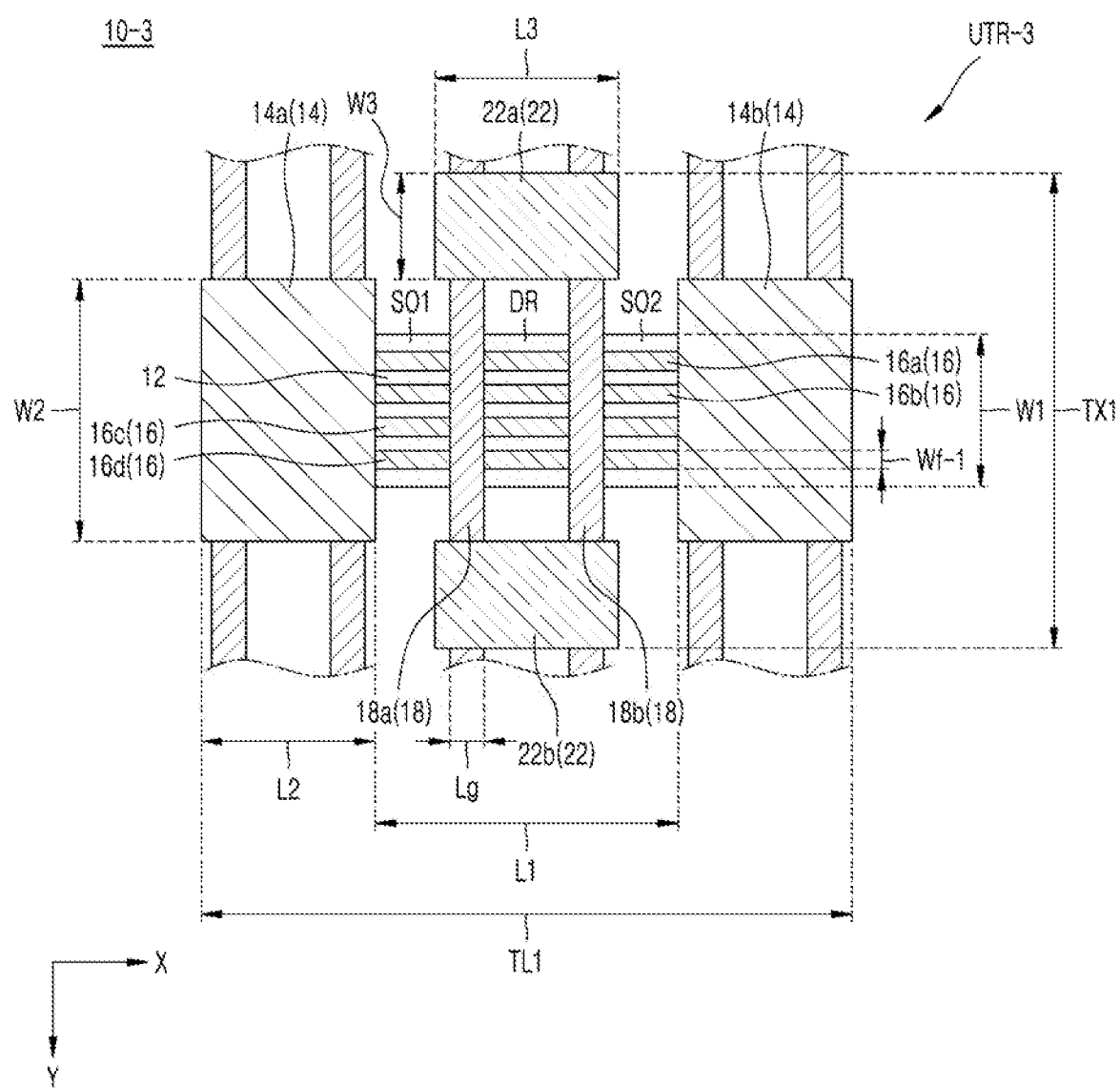
FIG. 14 is a layout diagram of an IC device including MOS transistors, according to an embodiment.

FIG. 14 is a layout diagram of an IC device including MOS transistors, according to an embodiment.

An IC device 10-3 of FIG. 14 may be the same as the IC device 10 of FIGS. 2 to 7 except for the number of fin active patterns 16. FIG. 14 may be a diagram corresponding to FIG. 3. In FIG. 14, the same reference numerals are used to denote the same elements as in FIGS. 2 to 7. In FIG. 14, the description of the same components as those of FIGS. 2 to 7 may be briefly presented or omitted.

The IC device 10-3 may include unit MOS transistors UTR-3. Hereinafter, the unit MOS transistor UTR-3 will mainly be described. The IC device 10-3 may include an active region 12, an active cutting region 14, the fin active pattern 16, a gate pattern 18, and an isolated gate contact region 22.

The active region 12 may extend in a first direction (X direction). The active region 12 may have a width W1 in a second direction (Y direction). The active region 12 may have a length L1 in the first direction (X direction).

The active cutting region 14 may be on a side of the active region 12 in the first direction (X direction). The active cutting region 14 may include a first active cutting region 14a and a second active cutting region 14b, which are respectively on opposite sides of the active region 12 in the first direction (X direction).

The active cutting region 14 may be a region in which the active region 12 is cut in a layout. The active cutting region 14 may be a region in which the gate pattern 18 is not formed, e.g., an insulating region. The active cutting region 14 may have a length L2 in the first direction (X direction). The active cutting region 14 may have a width W2 in the second direction (Y direction).

The fin active pattern 16 may extend in the first direction (X direction) on the active region 12. The fin active pattern 16 may include a first fin active pattern 16a, a second fin active pattern 16b, a third fin active pattern 16c, and a fourth fin active pattern 16d, which may be spaced apart from each other in the second direction (Y direction). The fin active pattern 16 may be a fin region. The fin active pattern 16 may include a silicon (Si) layer.

The fin active pattern 16 may include a first source region SO1, a drain region DR, and a second source region SO2, e.g., along the first direction (X direction). The first source region SO1, the drain region DR1, and the second source region SO2 may include a silicon layer including impurities.

The fin active pattern 16 may have a width Wf-1, e.g., individually, in the second direction (Y direction). The width Wf-1 of the fin active pattern 16 of FIG. 14 may be less than the width Wf of the fin active pattern 16 of FIG. 3.

The gate pattern 18 may extend across the active region 12 and the fin active pattern 16 in the second direction (Y direction) perpendicular to the first direction (X direction). The gate pattern 18 may not be located in or on the active cutting region 14.

The gate pattern 18 may have a gate length Lg in the first direction (X direction). The gate pattern 18 may intersect with the active region 12 and the fin active pattern 16 over the active region 12 and the fin active pattern 16 and may extend to the outside of the active region 12.

The gate pattern 18 may include a first gate pattern 18a and a second gate pattern 18b, which may be spaced apart from each other in the first direction (X direction). The isolated gate contact region 22 may be in contact with the gate pattern 18 outside the active region 12.

The unit MOS transistor UTR-3 of the IC device 10-3 may have a total length TL1 in the first direction (X direction) and a total width TX1 in the second direction (Y direction). The isolated gate contact region 22 may be a conductive region.

In an implementation, the unit MOS transistor UTR-3 of the IC device 10-3 may include two gate patterns 18 and four fin active patterns 16, viz., the first fin active pattern 16a, the second fin active pattern 16b, the third fin active pattern 16c, and the fourth fin-active pattern 16d.

The IC device 10-3 may obtain high output while improving RF performance, highly integrate individual transistors included in the unit MOS transistor UTR-3, and may help improve an operating speed and a degree of freedom for design.

Figure 15:
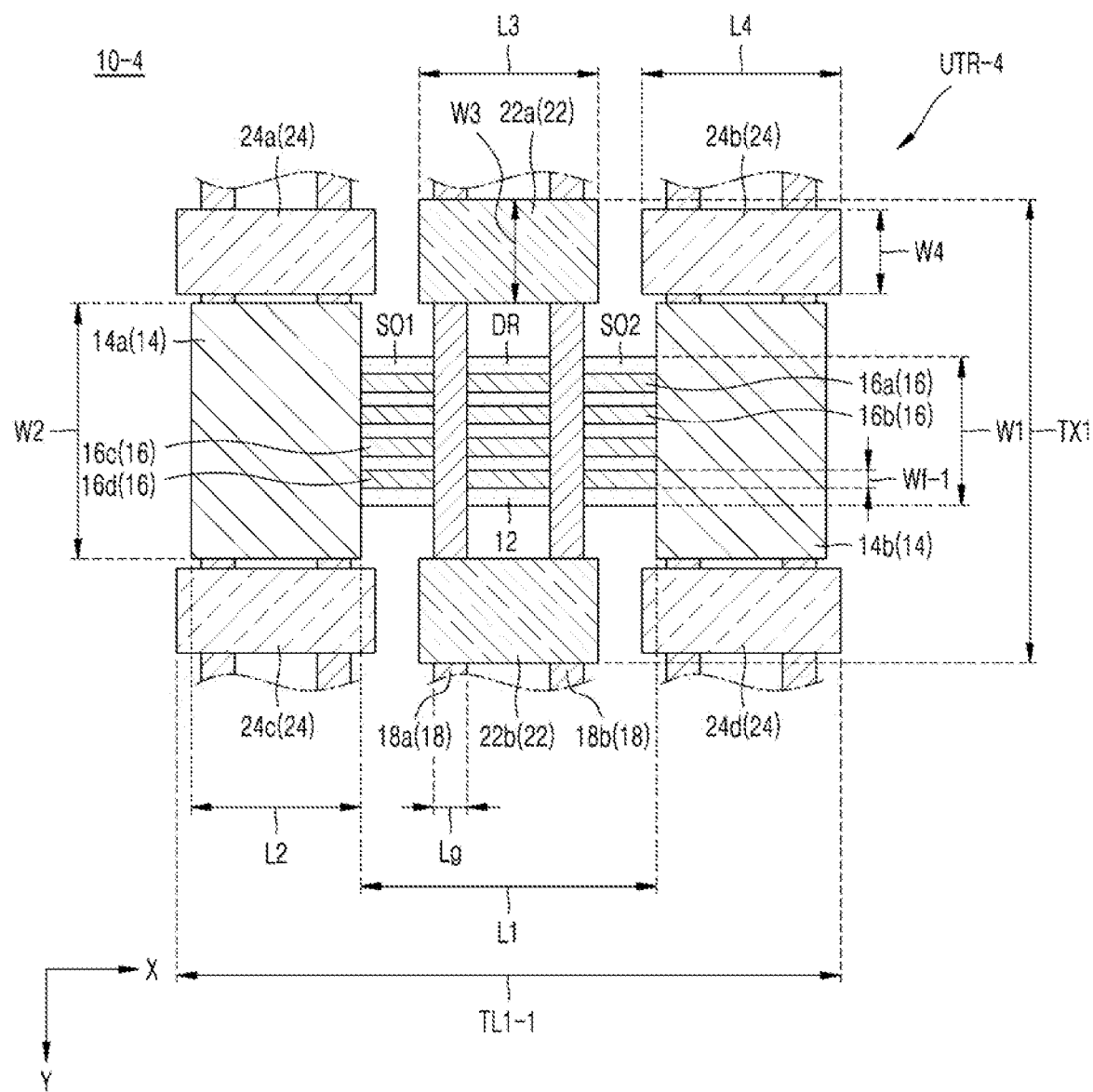
FIG. 15 is a layout diagram of an IC device including MOS transistors, according to an embodiment.

FIG. 15 is a layout diagram of an IC device 10-4 including MOS transistors, according to an embodiment.

The IC device 10-4 of FIG. 15 may be the same as the IC device 10-3 of FIG. 14 except that the IC device 10-4 of FIG. 15 includes a gate cutting region 24. In FIG. 15, the same reference numerals are used to denote the same elements as in FIGS. 2 to 7 and FIG. 14. In FIG. 15, the description of the same components as those of FIGS. 2 to 7 and FIG. 14 may be briefly presented or omitted.

The IC device 10-4 may include unit MOS transistors UTR-4. Hereinafter, the unit MOS transistor UTR-4 will mainly be described. The IC device 10-4 may include an active region 12, an active cutting region 14, a fin active pattern 16, a gate pattern 18, an isolated gate contact region 22, and a gate cutting region 24.

The active region 12 may extend in a first direction (X direction). The active region 12 may have a width W1 in a second direction (Y direction). The active region 12 may have a length L1 in the first direction (X direction).

The active cutting region 14 may be on one side of the active region 12 in the first direction (X direction). The active cutting region 14 may include a first active cutting region 14a and a second active cutting region 14b, which may be respectively on opposite sides of the active region 12 in the first direction (X direction). The active cutting region 14 may have a length L2 in the first direction (X direction). The active cutting region 14 may have a width W2 in the second direction (Y direction).

The fin active patterns 16 may extend in the first direction (X direction) on the active region 12. The fin active patterns 16 may include a first fin active pattern 16a, a second fin active pattern 16b, a third fin active pattern 16c, and a fourth fin active pattern 16d, which may be spaced apart from each other in the second direction (Y direction). The fin active pattern 16 may be a fin region.

The fin active pattern 16 may include a first source region SO1, a drain region DR, and a second source region SO2, e.g., along the first direction (X direction). The fin active pattern 16 may have a width Wf-1 in the second direction (Y direction). The width Wf-1 of the fin active pattern 16 of FIG. 15 may be less than the width Wf of the fin active pattern 16 of FIG. 3.

The gate pattern 18 may extend across the active region 12 and the fin active pattern 16 in the second direction (Y direction) perpendicular to the first direction (X direction). The gate pattern 18 may not be located in or on the active cutting region 14.

The gate pattern 18 may have a gate length Lg in the first direction (X direction). The gate pattern 18 may include a first gate pattern 18a and a second gate pattern 18b, which may be spaced apart from each other in the first direction (X direction). The isolated gate contact region 22 may be in contact with the gate pattern 18 outside the active region 12.

The gate cutting region 24 may be around the active region 12 and the fin active pattern 16. The gate cutting region 24 may be spaced apart from the gate pattern 18 on a side of the gate pattern 18 in the first direction (X direction). The gate cutting region 24 may include a first gate cutting region 24a, a second gate cutting region 24b, a third gate cutting region 24c, and a fourth gate cutting region 24d.

The gate cutting region 24 may have a length L4 in the first direction (X direction). The gate cutting region 24 may have a width W4 in the second direction (Y direction). The unit MOS transistor UTR-4 of the IC device 10-4 may have a total length TL1-1 in the first direction (X direction) and a total width TX1 in the second direction (Y direction).

In an implementation, the unit MOS transistor UTR-4 of the IC device 10-4 may include two gate patterns 18 and four fin active patterns 16, viz., the first fin active pattern 16a, the second fin active pattern 16b, the third fin active pattern 16c, and the fourth fin active pattern 16d.

The IC device 10-4 may obtain high output while improving RF performance, highly integrate individual transistors included in the unit MOS transistor UTR-4, and may help improve an operating speed and a degree of freedom for design.

Figure 16:
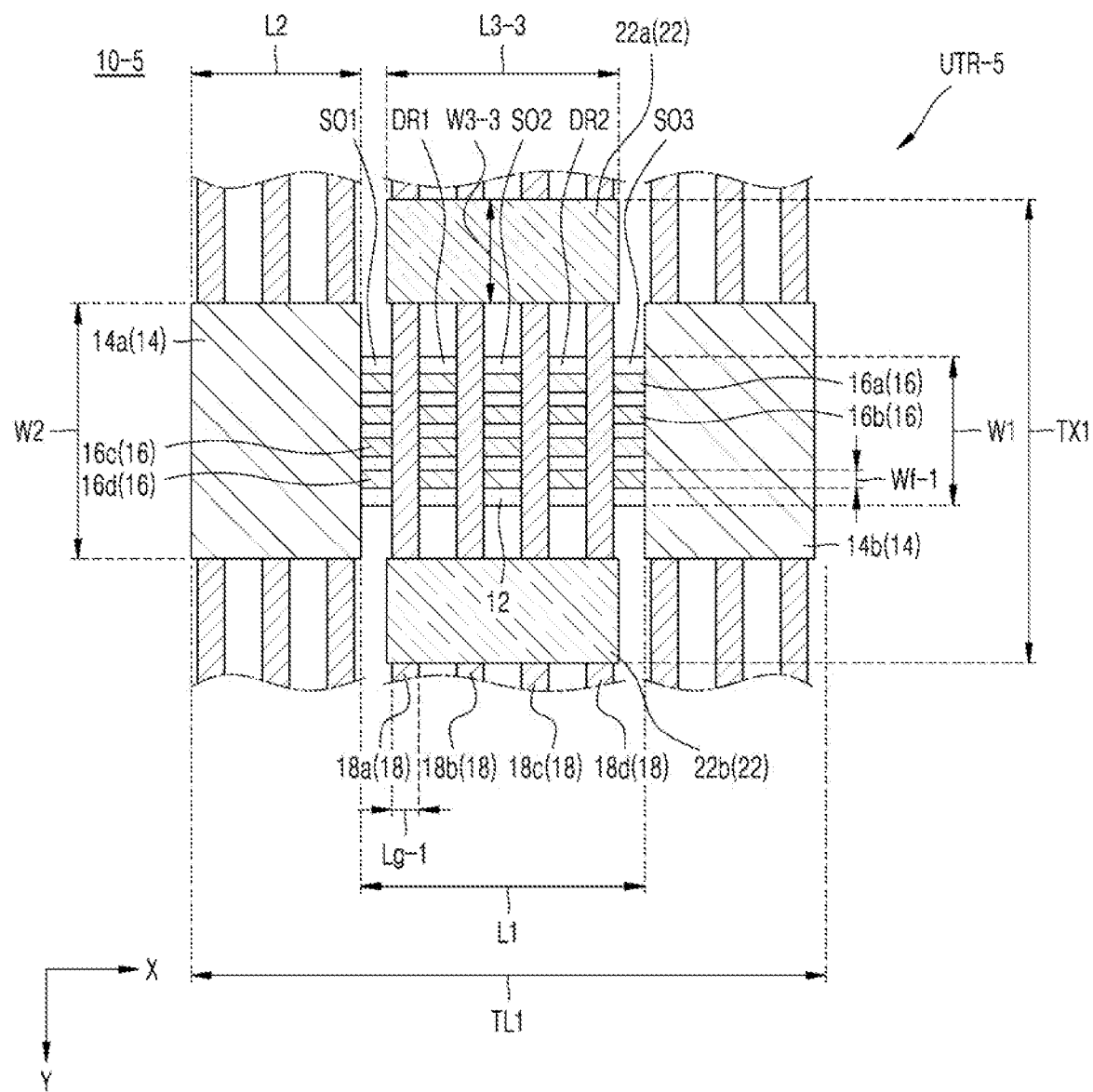
FIG. 16 is a layout diagram of an IC device including MOS transistors, according to an embodiment.

FIG. 16 is a layout diagram of an IC device 10-5 including MOS transistors, according to an embodiment.

The IC device 10-5 of FIG. 16 may be the same as the IC device 10-3 of FIG. 14 except for the number of gate patterns 18. In FIG. 16, the same reference numerals are used to denote the same elements as in FIGS. 2 to 7 and FIG. 14. In FIG. 16, the description of the same components as those of FIGS. 2 to 7 and FIG. 14 may be briefly presented or omitted.

The IC device 10-5 may include unit MOS transistors UTR-5. Hereinafter, the unit MOS transistor UTR-5 will mainly be described. The IC device 10-5 may include an active region 12, an active cutting region 14, a fin active pattern 16, a gate pattern 18, and an isolated gate contact region 22.

The active region 12 may extend in a first direction (X direction). The active region 12 may have a width W1 in the second direction (Y direction). The active region 12 may have a length L1 in the first direction (X direction).

The active cutting region 14 may be located on a side of the active region 12 in the first direction (X direction). The active cutting region 14 may include a first active cutting region 14a and a second active cutting region 14b, which may be respectively on opposite sides of the active region 12 in the first direction (X direction). The active cutting region 14 may have a length L2 in the first direction (X direction). The active cutting region 14 may have a width W2 in the second direction (Y direction).

The fin active pattern 16 may extend in the first direction (X direction) on the active region 12. The fin active pattern 16 may include a first fin active pattern 16a, a second fin active pattern 16b, a third fin active pattern 16c, and a fourth fin active pattern 16d, which are apart from each other in the second direction (Y direction).

The gate pattern 18 may extend across the active region 12 and the fin active pattern 16 in the second direction (Y direction) perpendicular to the first direction (X direction). The gate pattern 18 may not be located in the active cutting region 14.

The gate pattern 18 may have a gate length Lg in the first direction (X direction). The gate pattern 18 may include a first gate pattern 18a, a second gate pattern 18b, a third gate pattern 18c, and a fourth gate pattern 18d, which may be spaced apart from each other in the first direction (X direction).

In an implementation, the gate pattern 18 may include four gate patterns (e.g., the first to fourth gate patterns 18a to 18d), and the fin active pattern 16 may include a first source region SO1, a first drain region DR1, a second source region SO2, a second drain region DR2, and a third source region SO3, e.g., along the first direction (X direction).

The first source region SO1, the first drain region DR1, the second source region SO2, the second drain region DR2, and the third source region SO3 may include a silicon layer including impurities. The fin active pattern 16 may have a width Wf-1 in the second direction (Y direction).

The width Wf-1 of the fin active pattern 16 of FIG. 16 may be less than the width Wf of the fin active pattern 16 of FIG. 3. The isolated gate contact region 22 may be in contact with the gate pattern 18 outside the active region 12. The isolated gate contact region 22 may be a conductive region.

The unit MOS transistor UTR-5 of the IC device 10-5 may have a total length TL1 in the first direction (X direction) and a total width TX1 in the second direction (Y direction). The unit MOS transistor UTR-5 of the IC device 10-5 may include four gate patterns 18 and four fin active patterns 16.

The IC device 10-5 may obtain high output while improving RF performance, highly integrate individual transistors included in the unit MOS transistor UTR-5, and may help improve an operating speed and a degree of freedom for design.

Figure 17:
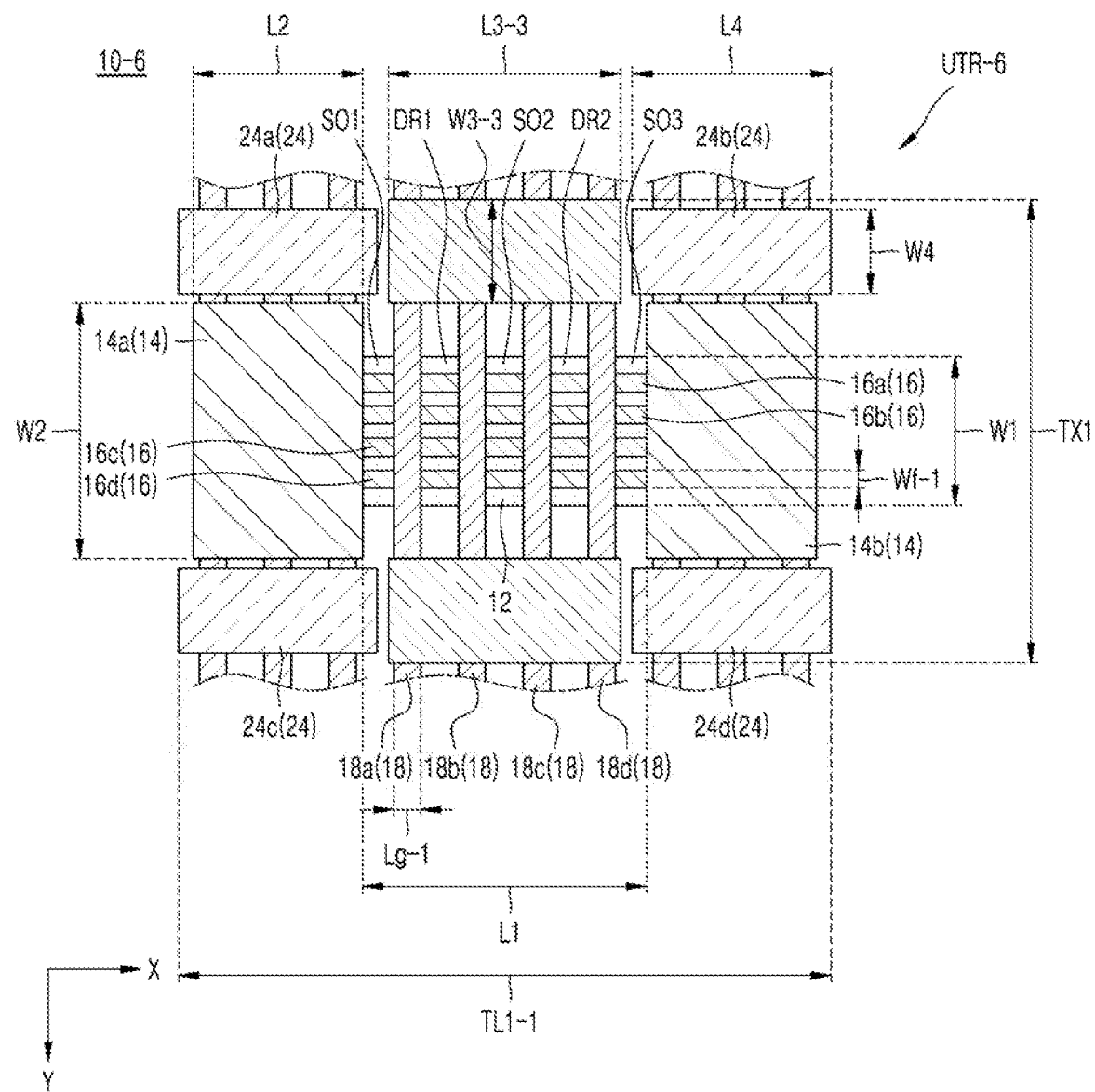
FIG. 17 is a layout diagram of an IC device including MOS transistors, according to an embodiment.

FIG. 17 is a layout diagram of an IC device 10-6 including MOS transistors, according to an embodiment.

The IC device 10-6 of FIG. 17 may be the same as the IC device 10-5 of FIG. 16 except that the IC device 10-6 of FIG. 17 includes a gate cutting region 24. In FIG. 17, the same reference numerals are used to denote the same elements as in FIGS. 2 to 7 and FIG. 16. In FIG. 17, the description of the same components as those of FIGS. 2 to 7 and FIG. 16 may be briefly presented or omitted.

The IC device 10-6 may include unit MOS transistors UTR-6. Hereinafter, the unit MOS transistor UTR-6 will mainly be described. The IC device 10-6 may include an active region 12, an active cutting region 14, a fin active pattern 16, a gate pattern 18, an isolated gate contact region 22, and a gate cutting region 24.

The active region 12 may extend in a first direction (X direction). The active region 12 may have a width W1 in a second direction (Y direction). The active region 12 may have a length L1 in the first direction (X direction).

The active cutting region 14 may be on a side of the active region 12 in the first direction (X direction). The active cutting region 14 may include a first active cutting region 14a and a second active cutting region 14b, which may be respectively on opposite sides of the active region 12 in the first direction (X direction). The active cutting region 14 may have a length L2 in the first direction (X direction). The active cutting region 14 may have a width W2 in the second direction (Y direction).

The fin active pattern 16 may extend in the first direction (X direction) on the active region 12. The fin active pattern 16 may include a first fin active pattern 16a, a second fin active pattern 16b, a third fin active pattern 16c, and a fourth fin active pattern 16d, which may be spaced apart from each other in the second direction (Y direction). The fin active pattern 16 may be a fin region.

The gate pattern 18 may extend across the active region 12 and the fin active pattern 16 in the second direction (Y direction) perpendicular to the first direction (X direction). The gate pattern 18 may not be located in the active cutting region 14.

The gate pattern 18 may have a gate length Lg-1 in the first direction (X direction). The gate pattern 18 may include a first gate pattern 18a, a second gate pattern 18b, a third gate pattern 18c, and a fourth gate pattern 18d, which may be spaced apart from each other in the first direction (X direction).

In an implementation, the gate pattern 18 may include four gate patterns (e.g., the first to fourth gate patterns 18a to 18d), and the fin active pattern 16 may include a first source region SO1, a first drain region DR1, a second source region SO2, a second drain region DR2, and a third source region SO3, e.g., along the first direction (X direction).

The first source region SO1, the first drain region DR1, the second source region SO2, the second drain region DR2, and the third source region SO3 may include a silicon layer including impurities. The fin active pattern 16 may have a width Wf-1 in the second direction (Y direction).

The width Wf-1 of the fin active pattern 16 of FIG. 16 may be less than the width Wf of the fin active pattern 16 of FIG. 3. The isolated gate contact region 22 may be in contact with the gate pattern 18 outside the active region 12. The isolated gate contact region 22 may be a conductive region.

The gate cutting region 24 may be around the active region 12 and the fin active pattern 16. The gate cutting region 24 may be spaced apart from the gate pattern 18 on a side of the gate pattern 18 in the first direction (X direction). The gate cutting region 24 may include a first gate cutting region 24a, a second gate cutting region 24b, a third gate cutting region 24c, and a fourth gate cutting region 24d. The gate cutting region 24 may have a length L4 in the first direction (X direction).

The gate cutting region 24 may have a width W4 in the second direction (Y direction). The unit MOS transistor UTR-6 of the IC device 10-6 may have a total length TL1-1 in the first direction (X direction) and a total width TX1 in the second direction (Y direction).

The unit MOS transistor UTR-6 of the IC device 10-6 may include four gate patterns 18 and four fin active patterns 16. The IC device 10-6 may obtain high output while further improving RF performance, highly integrate individual transistors included in the unit MOS transistor UTR-6, and may help improve an operating speed and a degree of freedom for design.

Figure 18:
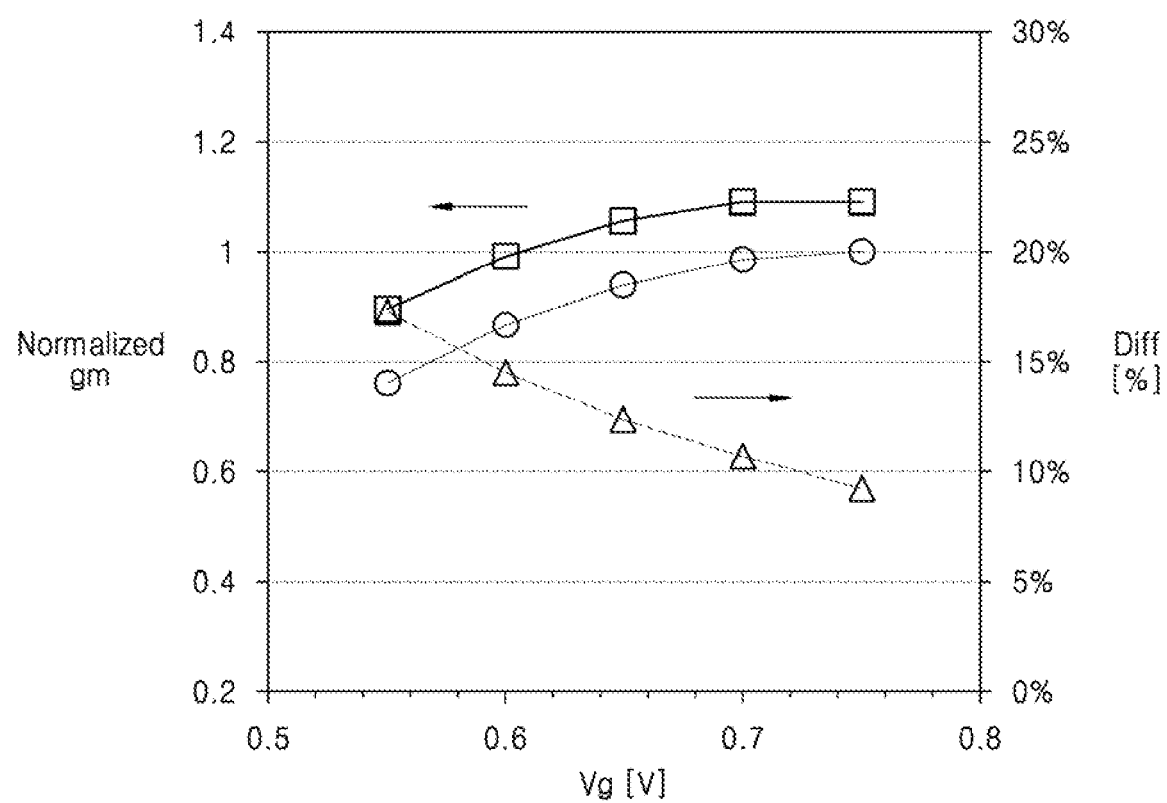
FIG. 18 is a graph showing results of a comparison of trans-conductance depending on whether a gate cutting region of an IC device according to an embodiment is applied.

FIG. 18 is a graph showing results of a comparison of trans-conductance depending on whether a gate cutting region of an IC device according to an embodiment is applied.

FIG. 18 is a graph of normalized trans-conductance gm with respect to gate voltage Vg depending on whether there is a gate cutting region. FIG. 18 shows trans-conductance gm obtained when the gate cutting region 24 is applied and not applied to the IC device 10-2 of FIGS. 11 to 13.

In FIG. 18, a square shape denotes a case in which the gate cutting region 24 is applied to the IC device 10-2, a circular shape denotes a case in which the gate cutting region 24 is not applied to the IC device 10-2, and a triangular shape denotes a trans-conductance difference Diff between the cases in which the gate cutting region 24 is applied and not applied. The trans-conductance difference Diff is denoted by the right ordinate.

As shown in FIG. 18, it may be seen that when the gate cutting region 24 is applied to the IC device 10-2, a stress effect (e.g., a tensile stress effect) may be produced, as compared to the case in which the gate cutting region 24 is not applied, and thus, the trans-conductance may be increased. In addition, it may be seen that the trans-conductance difference Diff between the cases in which the gate cutting region 24 is applied and not applied to the IC device 10-2 may increase as the gate voltage Vg is reduced.

Figure 19:
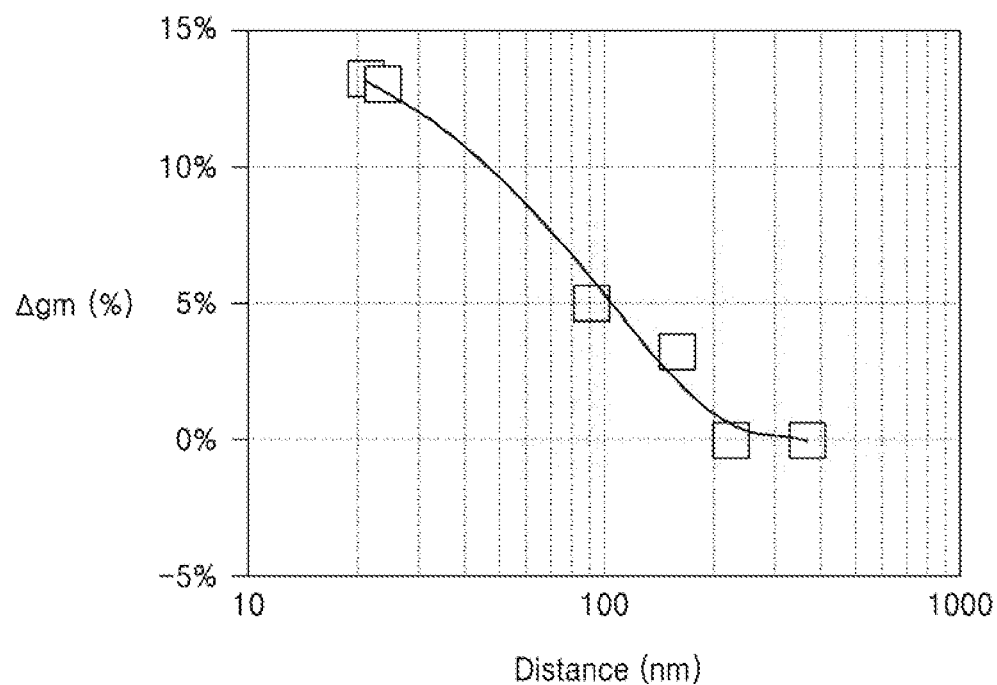
FIG. 19 is a graph showing results of a comparison of trans-conductance depending on whether a gate cutting region of an IC device according to an embodiment is applied.

FIG. 19 is a graph showing results of a comparison of trans-conductance depending on whether a gate cutting region of an IC device according to an embodiment is applied.

FIG. 19 is a graph of trans-conductance increase value Δgm with respect to distance between a gate pattern and the gate cutting region. For example, FIG. 19 shows a trans-conductance increase value Δgm with respect to a distance between the gate pattern 18 and the gate cutting region 24 in the IC device 10-2 of FIGS. 11 to 13.

Referring to FIG. 19, it may be seen that as the distance between the gate pattern 18 and the gate cutting region 24 in the IC device 10-2 is reduced, the trans-conductance increase value Δgm increases. In other words, it may be seen that as the distance between the gate pattern 18 and the gate cutting region 24 in the IC device 10-2 is reduced, a stress effect (i.e., a tensile stress effect) becomes relatively great, and thus, the trans-conductance increase value Δgm increases.

Figure 20:
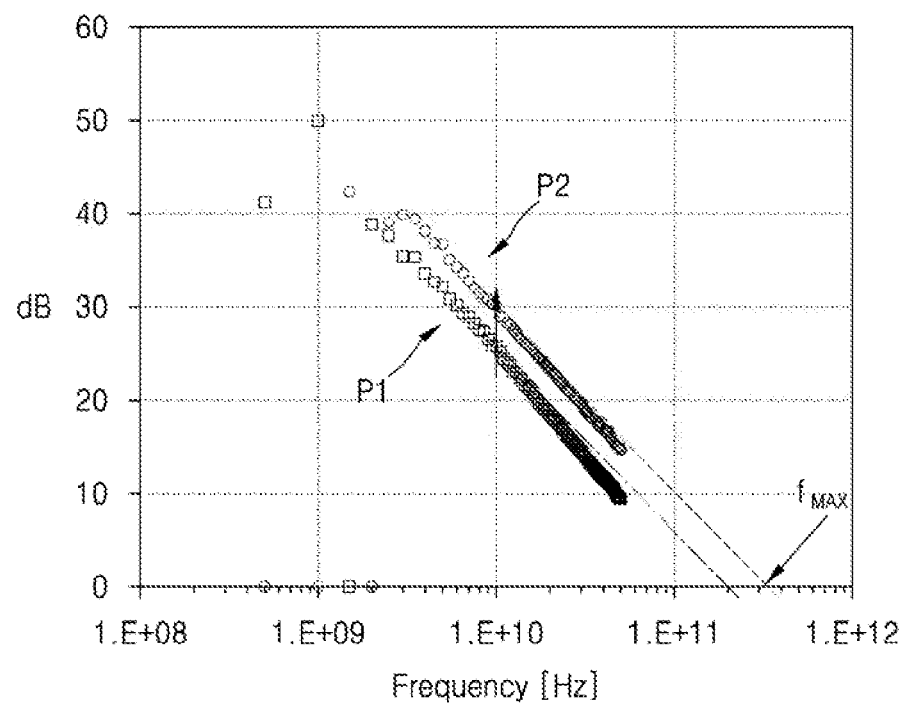
FIG. 20 is a graph showing a frequency response curve of a power gain of an IC device according to an embodiment.

FIG. 20 is a graph showing a frequency response curve of a power gain of an IC device according to an embodiment.

In FIG. 20, the abscissa denotes a frequency, and the ordinate denotes a power gain dB. In an implementation, in FIG. 20, a case in which the active cutting region 14, the isolated gate contact region 22, and the gate cutting region 24 are applied to or included in the IC device 10-2 of FIGS. 11 to 13 is denoted by P2, and a case in which the active cutting region 14, the isolated gate contact region 22, and the gate cutting region 24 are not applied to or included in the IC device 10-2 is denoted by P1. A maximum vibration frequency $f_{Max}$ may be a frequency at which a power gain becomes 1.

As shown in FIG. 20, a maximum vibration frequency $f_{Max}$ of the IC device 10-2 may be higher in the case P2 in which the active cutting region 14, the isolated gate contact region 22, and the gate cutting region 24 are applied to the IC device 10-2 than in the case P1 in which the active cutting region 14, the isolated gate contact region 22, and the gate cutting region 24 are not applied to the IC device 10-2. The maximum vibration frequency $f_{Max}$ of the IC device 10-2 may be proportional to a cut-off frequency $f_T$, and when the maximum vibration frequency $f_{Max}$ is high, the cut-off frequency $f_T$ may also be high.

In addition, at a specific frequency of, e.g., 1E10 hertz (Hz), it may be seen that a power gain of the IC device 10-2 is higher in the case P2 in which the active cutting region 14, the isolated gate contact region 22, and the gate cutting region 24 are applied to the IC device 10-2 than in the case P1 in which the active cutting region 14, the isolated gate contact region 22, and the gate cutting region 24 are not applied to the IC device 10-2

Figure 21:
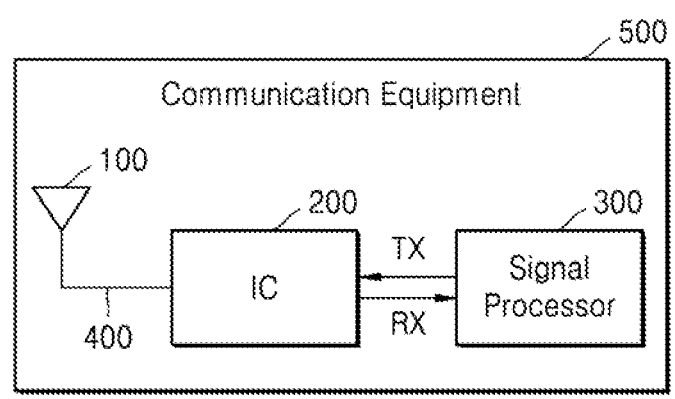
FIG. 21 is a diagram of communication equipment including an IC device, according to an embodiment.

FIG. 21 is a diagram of communication equipment 500 including an IC device 200, according to an embodiment.

The communication equipment 500 may include an antenna 100 and may communicate with another communication equipment in a wireless communication system by transmitting or receiving signals through the antenna 100. The communication equipment 500 may be referred to as wireless communication equipment.

The wireless communication system in which the communication equipment 500 communicates with the other communication equipment may be a wireless communication system using a cellular network, such as a 5th generation (5G) wireless system, a long-term evolution (LTE) system, an LTE-advanced system, a code division multiple access (CDMA) system, and a global system for mobile communications (GSM) system, a wireless local area network (WLAN) system, or another arbitrary wireless communication system. In an implementation, the wireless communication system may be a wireless communication system using a cellular network or another system.

As shown in FIG. 21, the communication equipment 500 may include the antenna 100, an IC device (or IC) 200, and a signal processor 300. The IC device 200 may be an RF IC device or an RF chip. The IC device 200 may include one of the IC devices 10 to 10-6 described above. The antenna 100 and the IC device 200 may be connected to each other through a feed line 400. The antenna 100, the feed line 400, and the IC device 200 may be referred to collectively as an RF system or an RF device.

In a transmission mode, the IC device 200 may process a transmission signal TX provided from the signal processor 300 and provide the generated signal to the antenna 100 through the feed line 15. In a receiving mode, the IC device 200 may process a signal received from the antenna 100 through the feed line 400 and provide a receiving signal RX to the signal processor 300. The signal processor 300 may generate a transmission signal TX by processing a signal including information to be transmitted, and generate a signal including information by processing a receiving signal RX.

By way of summation and review, highly integrated IC devices may require high performance and high output.

One or more embodiments may provide an integrated circuit (IC) device, which includes metal-oxide semiconductor (MOS) transistors and exhibits high performance and high output.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An integrated circuit device, comprising:
   an active region extending in a first direction;
   a plurality of fin active patterns extending in parallel on the active region in the first direction;
   a plurality of gate patterns spaced apart from each other in the first direction, the plurality of gate patterns extending across the active region and the fin active pattern in a second direction perpendicular to the first direction;
   a plurality of isolated gate contact regions, each isolated gate contact region of the plurality of isolated gate contact regions being spaced apart from opposite sides of the active region in the second direction and electrically connected to a first subset of the plurality of gate patterns; and
   a plurality of gate cutting regions at sides of the isolated gate contact regions in the first direction,
   wherein the plurality of gate cutting regions extend through a second subset of the plurality of gate patterns to thereby cut the second subset of the plurality of gate patterns into discontinuous sections within the active region.

2. The integrated circuit device as claimed in claim 1, wherein each isolated gate contact region of the plurality of isolated gate contact regions is electrically connected to at least two gate patterns.

3. The integrated circuit device as claimed in claim 1, wherein:
   each gate cutting region of the plurality of gate cutting regions is spaced apart from opposite sides of the active region in the second direction, and
   the plurality of gate cutting regions is arranged in the first direction.

4. The integrated circuit device as claimed in claim 1, wherein each gate cutting region of the plurality of gate cutting regions is alternately arranged with each isolated gate contact region of the plurality of isolated gate contact regions in the first direction.

5. The integrated circuit device as claimed in claim 1, wherein one arrangement of the plurality of isolated gate contact regions and the plurality of gate cutting regions is symmetrical to another arrangement of the plurality of isolated gate contact regions and the plurality of gate cutting regions with respect to the active region.

6. The integrated circuit device as claimed in claim 1, further comprising a plurality of active cutting regions on the active region, wherein each active cutting region of the plurality of active cutting regions is at respective sides of the plurality of fin active patterns in the first direction.

7. The integrated circuit device as claimed in claim 6, wherein both the plurality of gate cutting regions and the plurality of active cutting regions are insulating regions.

8. The integrated circuit device as claimed in claim 6, wherein the plurality of gate cutting regions and the plurality of active cutting regions are arranged in a line in the second direction.

9. The integrated circuit device as claimed in claim 8, wherein one arrangement of the plurality of gate cutting regions and the plurality of active cutting regions is symmetrical to another arrangement of the plurality of gate cutting regions and the plurality of active cutting regions with respect to the first subset of the plurality of gate patterns.

10. The integrated circuit device as claimed in claim 6, wherein a width in the second direction of the plurality of active cutting regions is greater than a width in the second direction of the active region.

11. The integrated circuit device as claimed in claim 6, wherein a length in the first direction of the plurality of gate cutting regions is greater than a length in the first direction of the plurality of active cutting regions.

12. The integrated circuit device as claimed in claim 6, wherein a length in the first direction of the plurality of isolated gate contact regions is greater than a length in the first direction of the plurality of active cutting regions.

13. The integrated circuit device as claimed in claim 6, further comprising a pair of combined gate cutting regions, wherein each combined gate cutting region of the pair of combined gate cutting regions is spaced apart in the second direction from the active region therebetween and extends in parallel in the first direction.

14. The integrated circuit device as claimed in claim 13, wherein a distance between the pair of combined gate cutting regions region and the active region is longer than a distance between the pair of combined gate cutting regions and the plurality of gate cutting regions.

15. The integrated circuit device as claimed in claim 13, wherein the first subset of the plurality of gate patterns continuously extend from a side of one combined gate cutting region to a side of another combined gate cutting region in the second direction.

16. The integrated circuit device as claimed in claim 13, wherein the second subset of the plurality of gate patterns are cut by the plurality of gate cutting regions and the plurality of active cutting regions and discontinuously extend from a side of one combined gate cutting region to a side of another combined gate cutting region in the second direction.

17. An integrated circuit device, comprising a unit cell array including multi transistors including:
   an active region extending in a first direction;
   a plurality of fin active patterns extending in parallel on the active region in the first direction;
   a plurality of gate patterns spaced apart from each other in the first direction, the plurality of gate patterns extending across the active region and the plurality of fin active patterns in a second direction perpendicular to the first direction;

a plurality of isolated gate contact regions, the active region being therebetween and spaced apart therefrom, wherein the plurality of isolated gate contact regions is electrically connected to a first subset of the plurality of gate patterns; and a plurality of gate cutting regions at sides of the plurality of isolated gate contact regions in the first direction, wherein the plurality of gate cutting regions extend through a second subset of the plurality of gate patterns to thereby cut the second subset of the plurality of gate patterns into discontinuous sections within the active region.

18. The integrated circuit device as claimed in claim 17, wherein:

the active region is spaced apart from and between two pairs of gate cutting regions of the plurality of gate cutting regions, and the plurality of isolated gate contact regions is between each pair of gate cutting regions of the plurality of gate cutting regions.

19. The integrated circuit device as claimed in claim 17, wherein each isolated gate contact region of the plurality of isolated gate contact regions is electrically connected to at least two gate patterns of the plurality of gate patterns.

20. The integrated circuit device as claimed in claim 17, wherein the plurality of gate cutting regions and the plurality of isolated gate contact regions are alternately arranged in the first direction.

21. The integrated circuit device as claimed in claim 20, wherein one arrangement of the plurality of isolated gate contact regions and the plurality of gate cutting regions is symmetrical to another arrangement of the plurality of isolated gate contact regions and the plurality of gate cutting regions with respect to the active region.

22. The integrated circuit device as claimed in claim 17, the unit cell array further includes a pair of active cutting regions on the active region, wherein the first subset of the plurality of gate patterns are spaced apart from and between the pair of active cutting regions.

23. The integrated circuit device as claimed in claim 22, wherein one arrangement of the plurality of gate cutting regions and the pair of active cutting regions is symmetrical to another arrangement of the plurality of gate cutting regions and the pair of active cutting regions with respect to the first subset of the plurality of gate patterns.

24. The integrated circuit device as claimed in claim 22, further comprising a pair of combined gate cutting regions, wherein:

the pair of combined gate cutting regions extends in parallel in the first direction, and the unit cell array is spaced apart from and between the pair of combined gate cutting regions.

25. The integrated circuit device as claimed in claim 24, wherein a distance between the pair of combined gate cutting regions and the active region is longer than a distance between the pair of combined gate cutting regions and the plurality of gate cutting regions.

26. The integrated circuit device as claimed in claim 24, wherein the first subset of the plurality of gate patterns continuously extend from a side of one combined gate cutting region of the pair of combined gate cutting regions to a side of another combined gate cutting region of the pair of combined gate cutting regions in the second direction.

27. The integrated circuit device as claimed in claim 24, wherein the second subset of the plurality of gate patterns are cut by the plurality of gate cutting regions and the pair of active cutting regions and discontinuously extend from a side of one combined gate cutting region of the pair of combined gate cutting regions to a side of another combined gate cutting region of the pair of combined gate cutting regions in the second direction.

* * * * *